United States Patent
Santhosh Kumar et al.

(10) Patent No.: US 12,184,295 B2
(45) Date of Patent: Dec. 31, 2024

(54) ADC CIRCUITRY COMPRISING COMPENSATION CIRCUITRY

(71) Applicant: Socionext Inc., Kanagawa (JP)

(72) Inventors: Sandeep Santhosh Kumar, Maidenhead (GB); Jayaraman Kumar, Maidenhead (GB); Armin Jalili Sebardan, Maidenhead (GB); Martin Wilson, Maidenhead (GB)

(73) Assignee: SOCIONEXT INC., Kanagawa (JP)

( * ) Notice: Subject to any disclaimer, the term of this patent is extended or adjusted under 35 U.S.C. 154(b) by 168 days.

(21) Appl. No.: 17/880,417

(22) Filed: Aug. 3, 2022

(65) Prior Publication Data

US 2023/0058077 A1 Feb. 23, 2023

(30) Foreign Application Priority Data

Aug. 23, 2021 (EP) .................................... 21192687

(51) Int. Cl.
*H03M 1/06* (2006.01)
(52) U.S. Cl.
CPC ................................ *H03M 1/0604* (2013.01)
(58) Field of Classification Search
CPC ............. H03M 1/0604; H03M 1/0678; H03M 1/0863; H03M 1/468; H03M 1/804; H03M 1/403
USPC .......................................... 341/118, 120, 155
See application file for complete search history.

(56) References Cited

U.S. PATENT DOCUMENTS

| 8,344,925 | B1 * | 1/2013 | Evans ................... | H03M 1/462 |
| | | | | 341/120 |
| 9,223,332 | B1 | 12/2015 | Himmelbauer et al. | |
| 9,935,643 | B1 | 4/2018 | Chang et al. | |
| 10,050,639 | B1 * | 8/2018 | Berens ................. | H03M 1/687 |
| 10,116,318 | B1 * | 10/2018 | Sharif .................. | H03M 1/125 |
| 2015/0207518 | A1 | 7/2015 | Liu et al. | |

(Continued)

OTHER PUBLICATIONS

Extended European Search Report dated Feb. 4, 2022 issued in the corresponding European Patent Application No. 21192687.8.

(Continued)

*Primary Examiner* — Jean B Jeanglaude
(74) *Attorney, Agent, or Firm* — Rimon P.C.

(57) ABSTRACT

Analogue-to-digital converter, ADC, circuitry including: successive-approximation circuitry configured in a subconversion operation to draw a charge from a first voltage reference, REF1; compensation circuitry including a compensation capacitor and configured, in a precharge operation, to connect the compensation capacitor so that the compensation capacitor stores a compensation charge, and, in the subconversion operation, to connect the compensation capacitor to the first voltage reference so that a charge is injected into the first voltage reference, REF1; and control circuitry, wherein: the successive-approximation circuitry and the compensation circuitry are configured such that one or more parameters defining at least one of said charges are controllable; and the control circuitry is configured to adjust at least one said parameter to adjust an extent to which the charge injected into the first voltage reference, REF1, by the compensation circuitry compensates for the charge drawn from the first voltage reference, REF1, by the successive-approximation circuitry.

12 Claims, 17 Drawing Sheets

(56) References Cited

U.S. PATENT DOCUMENTS

2017/0346498 A1 11/2017 Lin et al.
2018/0234106 A1* 8/2018 Tang .................. H03M 1/466
2019/0229741 A1 7/2019 Linkewitsch et al.

OTHER PUBLICATIONS

Iniyavan Elumalai, "A Capacitance-Based Reference Scheme for a 14b-Linear, 100 MS/s SAR-Assisted Pipeline ADC," Master of Science Thesis, for the degree of Master of Science in Microelectronics at Delft University of Technology, Aug. 21, 2012, 102 pages.

* cited by examiner

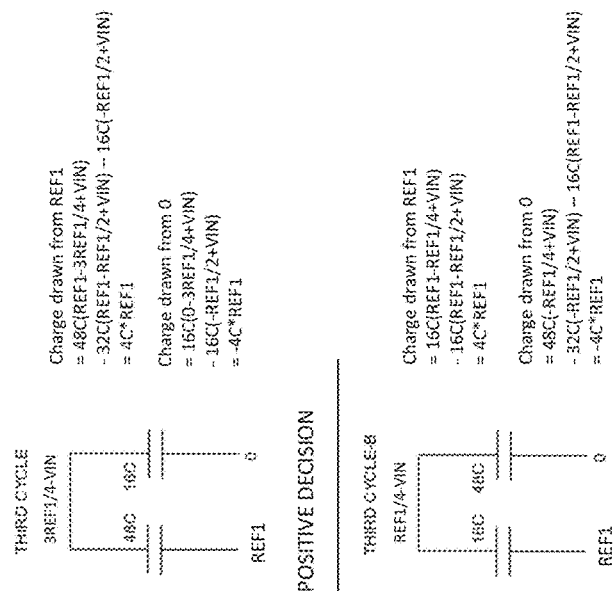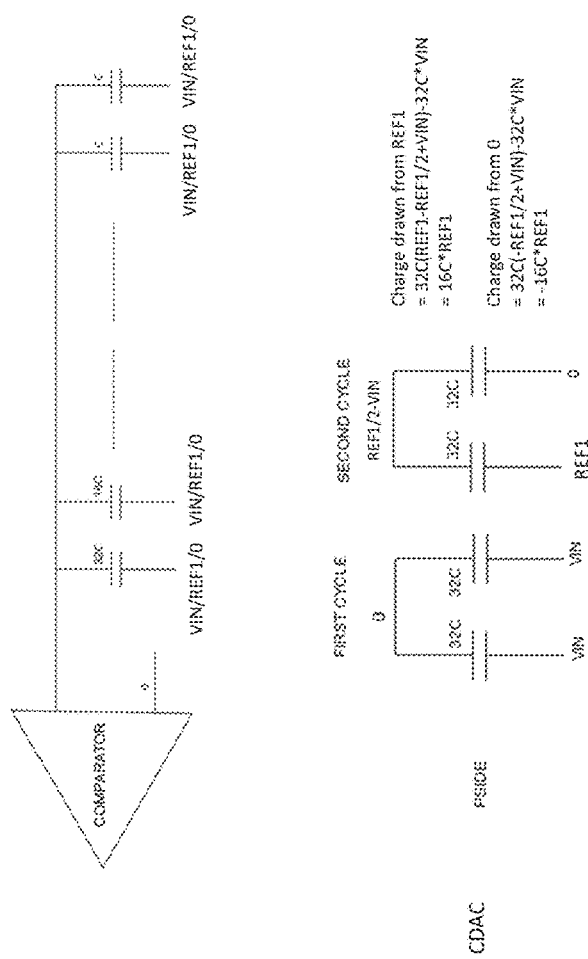
FIGURE 15

ADC CIRCUITRY COMPRISING COMPENSATION CIRCUITRY

CROSS-REFERENCE OF RELATED APPLICATIONS

This application claims the benefit of European Patent Application No. 21192687.8, filed on Aug. 23, 2021, the entire disclosure of which Application is incorporated by reference herein.

BACKGROUND

The present invention relates to analogue-to-digital converter (ADC) circuitry, in particular to ADC circuitry comprising compensation circuitry. Such compensation circuitry may be provided independently of the ADC circuitry in some arrangements. Embodiments may be provided, for example, as (or as part of) an integrated circuit.

ADC circuitry may be configured to use successive approximation to arrive at a multi-bit digital value representative of an analogue input value, and may itself comprise DAC (digital-to-analogue converter) circuitry such as CDAC (Capacitive DAC) circuitry. A successive approximation register (SAR) ADC typically uses a comparator in each of its successive approximation (sub-conversion) operations. Successive-approximation conversion may be considered as one example of a conversion process which is made up of a sequence of such sub-conversion operations.

In order to provide context for embodiments of the present invention, aspects of a previously-considered SAR ADC will now be considered.

FIG. 1 is a schematic diagram of SAR ADC circuitry 100. The SAR ADC circuitry 100 is implemented as differential circuitry and can be considered to be an example implementation of a sub-ADC unit (as for example may be used in ADC circuitry having an array of such sub-ADC units, e.g. operating in a time-interleaved manner).

The ADC circuitry 100 comprises a differential analogue input terminal 110 (shown with a pair of sampling switches), a comparator 120 and successive-approximation control circuitry 180 (labelled in FIG. 1 as a "SAR Control Unit", and which may be referred to simply as successive-approximation circuitry or SAR circuitry). Also shown is a voltage reference source 150, referred to herein as a first voltage reference, which may be considered generally part of the SAR ADC circuitry 100.

The analogue input terminal 110 is connected to receive an analogue input voltage signal $V_{IN}$ (which may correspond to a differential pair of charge pulses).

The comparator 120 has first and second comparator-input terminals 122 and 124, and a comparator-output terminal 126, and is operable to generate a comparison result (e.g. a logic 1 or 0) at its comparator-output terminal 126 based on a potential difference applied across the comparator-input terminals 122 and 124. The successive-approximation control circuitry 180 is configured to apply a potential difference across the first and second input terminals based upon the input voltage signal $V_{IN}$ during the sample phase, and configured to control the potential difference for each of a series of successive-approximation operations through charge redistribution as will become apparent, the control applied in each successive-approximation operation being dependent on a comparison result generated by the comparator 120 in the preceding approximation operation.

As shown in FIG. 1, the successive-approximation control circuitry 180 outputs control signals to a charge reset switch 115, a plurality of capacitor switches 160 and a corresponding plurality of capacitors 170. Being differential circuitry, differential sets of capacitor switches 160 and capacitors 170 are shown, and may be referred to as "positive" capacitor switches 160 and capacitors 170 (lower half) and "negative" capacitor switches 160 and capacitors 170 (upper half). All of the capacitors 170 are discrete capacitors configured to have nominal capacitances (i.e. whose actual capacitances may be subject to process-related inaccuracies).

As indicated, the capacitors 170 which are connected to capacitor switches 160 are weighted (to provide a binary weighting successive-approximation search) to correspond to 6 bits, configuring the ADC circuitry 100 as a 6-bit ADC. These 6 bits will be referred to, from MSB (most significant bit) to LSB (least significant bit), as MSB, MSB−1, MSB−2, LSB+2, LSB+1, and LSB, respectively. Thus, the upper 3 bits (in terms of digital significance) may be considered in an MSB grouping of bits and the lower 3 bits may be considered in an LSB grouping of bits.

Also shown is termination bit (pair of capacitors), referred to as TERM. This bit has the same weighting as the LSB and is included such that the MSB capacitor weighting is equivalent to the sum of the weights of all less significant capacitors. In FIG. 1, the MSB capacitor weighting is 32C and this is equivalent to 16C+8C+4C+2C+C+C. The corresponding termination capacitors are not switched.

The capacitors 170 which are connected to capacitor switches 160 have first and second capacitor terminals, their first terminals being connected to one of the comparator-input terminals 122 and 124, and their second terminals being connected via respective capacitor switches 160 to the first voltage reference 150, as indicated. It will be understood that each capacitor switch 160 is operable to connect the second terminal of its capacitor 170 to either a REF1 voltage supply, a −REF1 voltage supply or a $V_M$ (or $V_{MID}$) voltage supply being halfway in voltage level between the REF1 and −REF1 voltage levels, these all being nodes of the first voltage reference 150.

For ease of understanding, it will be assumed that $V_M$ has the value 0V (i.e. ground) so that the ΔV between REF1 and $V_M$ is +REF1, the ΔV between −REF1 and $V_M$ is −REF1, and the ΔV between REF1 and −REF1 is +2*REF1. This is, however, just an example and in practice $V_M$ may have a value other than 0V.

Not shown are (optional) capacitors 170 which are not connected to capacitor switches 160. For example, a differential pair of gain-trim capacitors may be connected to the respective input terminals of the comparator. These capacitors have first and second capacitor terminals, their first terminals being connected to (or at) one of the comparator-input terminals 122 and 124, and their second terminals being connected to ground (or another reference voltage).

The charge reset switch 115 is connected between the comparator input terminals effectively to zero a potential difference between the comparator input terminals.

As also shown in FIG. 1, the SAR control unit 180 is connected to be controlled by the comparison result output from the comparator-output terminal 126 and is configured to control the charge reset switch 115 by way of a control signal marked "Reset" and the capacitor switches 160 by way of a control signal marked "CDAC switches" (shown as a pair of control signals). The SAR control unit 180 also controls the sampling switches at the input terminals 110 by way of a control signal marked "Sample".

In some arrangements, one or more of the capacitors 170 may be a variable capacitor and this is indicated in FIG. 1 for a few of the capacitors 170 for convenience. A control signal (not shown) may be provided by the SAR control unit 180 in order to control the nominal capacitances of those variable capacitors.

As also shown in FIG. 1, the SAR control unit 180 outputs the eventual digital output value representative of a given $V_{IN}$ sample.

It will be appreciated that the capacitors 170 which are connected to capacitor switches 160 in FIG. 1 are given example relative capacitance values 32C, 16C, 8C, 4C, 2C, C from MSB to LSB, so that their contribution to storing charge (absent any differences between the voltage differences across them) is weighted. The values 32C, 16C, 80, 4C, 2C and C are binary weighted to allow a binary search. Alternatively, capacitance values (of some or all of the capacitors) may be the same as one another, but their associated reference voltages may be weighted to enable a binary search. Incidentally, a binary search is adopted here for simplicity, however it will be appreciated that non-binary searching may also be applied and the present disclosure will be understood accordingly.

To convert a given analogue input voltage signal $V_{IN}$ sample into a representative digital output value, first all of the capacitors 170 which are connected to capacitor switches 160 are connected at their second capacitor terminals to $V_M$ by virtue of the control signal "CDAC switches" and the charge reset switch 115 is closed. Then the charge reset switch 115 is opened and the input voltage signal $V_{IN}$ is sampled at the input terminal 110 via the sampling switches to the first capacitor terminals to the comparator-input terminal. In this state, the capacitors 170 (connected to a given comparator-input terminal) all have the same potential difference across them, and thus the charge stored on them is weighted by their relative capacitance values. The sampling switches are then opened (with the capacitor switches 160 left in their existing state) and the amount of charge on the capacitors 170 is then effectively held with the potential difference between the capacitor-input terminals dependent on $V_{IN}$. This is the "start" state.

The successive-approximation (subconversion) operations then proceed one-by-one, each operation controlling a successive one of the differential pairs of capacitors 170 from the MSB pair to the LSB pair in FIG. 1. In the subsequent operations, referred to as MSB to LSB to correspond to the evaluated bits, the switching applied in the negative side is applied inversely (effectively in the opposite direction) in the positive side. For example, if in one of the operations a negative capacitor switch 160 switches from $V_M$ to REF1 (i.e. ΔV for the capacitor concerned is +REF1) the corresponding positive capacitor switch 160 switches from $V_M$ to −REF1 (i.e ΔV for the capacitor concerned is −REF1).

Thus, firstly in the MSB operation, the comparator 120 outputs a comparison result in the start state. If the result is negative (logic 0), the negative capacitor switch concerned 160 is switched to −REF1 and the corresponding positive capacitor switch 160 switches to REF1 and the MSB bit of the raw digital output value is assigned value 0. If, however, the result is positive (logic 1), the negative capacitor switch concerned 160 is switched to REF1 and the corresponding positive capacitor switch 160 switches to −REF1 and the MSB bit of the raw digital output value is assigned value 1. Either way, the switching of the MSB capacitor switches 160 causes the (fixed) total amount of charge stored on the capacitors 170 to be redistributed and the potential difference between the comparator-input terminals 122 and 124 to change accordingly. For the avoidance of doubt, the MSB−1, MSB−2, LSB+2, LSB+1 and LSB capacitor switches 160 are not switched in this operation, and this general idea applies mutatis mutandis to the further operations. The next operation can then begin.

In the MSB−1 operation, the comparator outputs a comparison result in the existing state. If the result is negative (logic 0), the negative capacitor switch concerned 160 is switched to −REF1 and the corresponding positive capacitor switch 160 switches to REF1 and the MSB−1 bit of the raw digital output value is assigned value 0. If, however, the result is positive (logic 1), the negative capacitor switch concerned 160 is switched to REF1 and the corresponding positive capacitor switch 160 switches to −REF1 and the MSB−1 bit of the raw digital output value is assigned value 1. Again, the switching of the MSB−1 capacitor switches 160 causes the charge stored on the capacitors 170 to be redistributed.

The MSB−2, LSB+2, LSB+1 and LSB operations proceed in a similar fashion and duplicate description will be omitted. At the end of the operations, a final comparison can be carried out which may give a further bit (i.e. a bit 7) and thus the raw digital output value, e.g. 1110000, is produced. This value is referred to as a "raw" value since there may be some subsequent "correction" of this result in the SAR control unit 180 (or in other circuitry such as a processor connected thereto and not shown in FIG. 1).

It will be appreciated that the arrangement of 6 bits in FIG. 1, i.e. comprising the MSB group of bits MSB, MSB−1, MSB−2 and the LSB group of bits LSB+2, LSB+1 and LSB, is just an example and the ADC circuitry 100 may be configured to have any number of bits and division between MSB bits and LSB bits. For example, the MSB grouping of bits may extend up by further bits so that the MSB, MSB−1 bits of that arrangement have 128C and 64C capacitors, respectively. A segmented topology may also be provided, for example with segmentation capacitors separating the first capacitor terminals of the MSB−2 and LSB+2 capacitors on both the positive and negative sides (in which case the comparator input terminals would need to be connected on the left-hand side of the segmentation capacitors, rather than on the right-hand side).

It will also be appreciated that the arrangement of the capacitors 170 and capacitor switches 160 may be referred to as a CDAC 190 as indicated, with the control signal "CDAC switches" corresponding to its digital input, and the potential difference across the capacitor-input terminals corresponding to its analogue output. The combination of the capacitors 170 and capacitor switches 160 may be referred to herein also as successive-approximation circuitry, and such successive-approximation circuitry may also comprise the successive-approximation control circuitry (SAR control circuitry) 180.

It will also be appreciated, that the arrangement of the capacitors 170, capacitor switches 160, comparator 120, input terminals 110, and SAR control circuitry 180 may be referred to collectively as a SAR ADC 130 as indicated.

FIG. 2 is a schematic diagram of the ADC unit (sub-ADC unit) 100, presented as a block diagram 100-A for ease of understanding. Analogue input voltage signal $V_{IN}$ is passed into SAR ADC 130. The first voltage reference 150 is connected to the ADC. SAR ADC unit 130 outputs a digital output signal based on the analogue input signal after the SAR process has completed.

The first voltage reference 150 comprises a plurality of first voltage reference nodes, or REF1 nodes, as shown by a grouped connection between the first voltage reference 150 and the SAR ADC 130, indicating one or more connections.

The plurality of REF1 nodes have different defined voltage levels. The plurality of REF1 nodes comprises at least a first REF1 node and a second REF1 node. For example, the plurality of REF1 nodes may comprise a positive first reference voltage and a negative first reference voltage, or a positive first reference voltage and a ground voltage. In the FIG. 1 arrangement, the plurality of REF1 nodes comprises a positive first reference voltage, a middle first reference voltage and a negative first reference voltage (shown in FIG. 1 as REF1, $V_M$, and −REF1, respectively). These first voltage reference nodes are connected to the first terminal of the plurality of capacitor switches 160 as shown in FIG. 1.

Before considering a detailed embodiment, a problem associated with ADC units 100 will be considered. It will be appreciated, with reference to FIG. 1, that the problem is particularly associated with the CDAC 190 and thus that an equivalent problem is associated with CDAC units 190.

Typically, in such previously-considered CDAC units 190, ADC units 100, or generally in a SAR ADC 130, the SAR ADC is configured to successively approximate the input voltage signal by performing the binary search function as explained above. During a given subconversion switching operation, the ADC unit 100 may switch at least one of the array of capacitors between different REF1 nodes such that a first charge is drawn from a first REF1 node and a second charge is injected into a second REF1 node, and such first and second charges will be referred to later herein. This causes the voltage level of said REF1 nodes, and ultimately the first voltage reference, to fluctuate in voltage level.

This fluctuation can negatively impact the accuracy of the SAR ADC 130 (and/or other devices connected to the same voltage reference), leading to noise/distortion. Over time, the voltage settles back to the reference value, or stable value, but such a settling time can limit the frequency of operation.

It is desirable to address such problems.

SUMMARY

According to an embodiment of a first aspect of the present invention there is provided analogue-to-digital converter, ADC, circuitry comprising: successive-approximation circuitry configured in a subconversion operation to draw a charge from a first voltage reference, REF1; compensation circuitry comprising at least one compensation capacitor and configured, in a precharge operation prior to the subconversion operation, to connect the at least one compensation capacitor so that the at least one compensation capacitor stores a compensation charge, and, in the subconversion operation, to connect the at least one compensation capacitor to the first voltage reference so that a charge is injected into the first voltage reference, REF1; and control circuitry, wherein: the successive-approximation circuitry and the compensation circuitry are configured such that one or more parameters defining at least one of said charges are controllable; and the control circuitry is configured to adjust at least one said parameter to adjust an extent to which the charge injected into the first voltage reference, REF1, by the compensation circuitry compensates for the charge drawn from the first voltage reference, REF1, by the successive-approximation circuitry.

According to an embodiment of a second aspect of the present invention there is provided analogue-to-digital converter, ADC, circuitry comprising: successive-approximation circuitry configured in a subconversion operation to draw a charge from a first voltage reference, REF1; compensation circuitry configured, in a precharge operation prior to the subconversion operation, to store a compensation charge, and, in the subconversion operation, to connect to the first voltage reference so that a charge dependent on the compensation charge is injected into the first voltage reference, REF1; and control circuitry, wherein: the successive-approximation circuitry and the compensation circuitry are configured such that one or more parameters defining at least one of said charges are controllable; and the control circuitry is configured to adjust at least one said parameter to adjust an extent to which the charge injected into the first voltage reference, REF1, compensates for the charge drawn from the first voltage reference, REF1.

According to an embodiment of a third aspect of the present invention there is provided analogue-to-digital converter, ADC, circuitry comprising: a first voltage reference, REF1, having a plurality of REF1 nodes having different defined voltage levels; a second voltage reference, REF2, having a plurality of REF2 nodes having different defined voltage levels; successive-approximation circuitry comprising an array of capacitors and configured in a subconversion operation to switch at least one of the array of capacitors between different REF1 nodes such that a first charge is drawn from a first REF1 node and a second charge is injected into a second REF1 node; compensation circuitry comprising at least one compensation capacitor and configured, in a precharge operation prior to the subconversion operation, to connect the at least one compensation capacitor between different REF2 nodes so that the at least one compensation capacitor stores a compensation charge, and, in the subconversion operation, to connect the at least one compensation capacitor between the first and second REF1 nodes so that a third charge is injected into the first REF1 node and a fourth charge is drawn from the second REF1 node; and control circuitry, wherein: the successive-approximation circuitry and the compensation circuitry are configured such that one or more parameters defining said charges are controllable; and the control circuitry is configured to adjust at least one said parameter to adjust an extent to which the third and fourth charges compensate for the first and second charges, respectively.

According to an embodiment of a fourth aspect of the present invention there is provided analogue-to-digital converter, ADC, circuitry comprising: an ADC unit for carrying out analogue-to-digital subconversion operations to convert respective analogue signals into corresponding digital output values; and a compensating unit for supplying a compensatory charge to a voltage reference during a given conversion operation to compensate for a charge drawn by the ADC unit from the voltage reference during the given conversion operation, wherein: before the given conversion operation, the compensating unit is charged toward a compensatory charge value; and the ADC circuitry is configured such that the compensatory charge is variable, either by varying the capacitance of the compensating unit, or by varying the voltage across the compensating unit.

According to any of the first to fourth aspects, by adjusting the at least one said parameter to adjust an extent to which the charge injected into the first voltage reference compensates for the charge drawn from the first voltage reference, the ADC circuitry can better match the drawn and injected charges. Better matching reduces the settling time of the first voltage reference. This reduction in settling time allows for increased operation speed or operation frequency, and reduced noise.

According to an embodiment of a fifth aspect of the present invention there is provided analogue-to-digital converter, ADC, circuitry comprising: successive-approximation circuitry configured in a subconversion operation to draw a charge from a first voltage reference, REF1; and compensation circuitry comprising at least one compensation capacitor and configured, in a precharge operation prior to the subconversion operation, to connect the at least one compensation capacitor between nodes of a second voltage reference, REF2, so that the at least one compensation capacitor stores a compensation charge, and, in the subconversion operation, to disconnect the at least one compensation capacitor from at least one of said nodes of the second voltage reference, REF2, whose voltage is regulated by the second voltage reference, REF2, and connect the at least one compensation capacitor between nodes of the first voltage reference, REF1, so that a charge is injected into the first voltage reference, REF1.

According to an embodiment of a sixth aspect of the present invention there is provided analogue-to-digital converter, ADC, circuitry comprising: successive-approximation circuitry configured in a subconversion operation to draw a charge from a first voltage reference, REF1; and compensation circuitry configured, in a precharge operation prior to the subconversion operation, to connect to nodes of a second voltage reference, REF2, to store a compensation charge, and, in the subconversion operation, to disconnect from at least one of said nodes of the second voltage reference, REF2, whose voltage is regulated by the second voltage reference, REF2, and connect to the first voltage reference, REF1 so that a charge is injected into the first voltage reference, REF1.

According to an embodiment of a seventh aspect of the present invention there is provided analogue-to-digital converter, ADC, circuitry comprising: a first voltage reference, REF1, having a plurality of REF1 nodes having different defined voltage levels, the plurality of REF1 nodes comprising a first REF1 node and a second REF1 node, the first voltage reference configured to regulate the voltage level of the first REF1 node relative to the voltage level of the second REF1 node or to regulate the voltage level of the first REF1 node and the voltage level of the second REF1 node relative to a voltage level of a first shared reference node; a second voltage reference, REF2, having a plurality of REF2 nodes having different defined voltage levels, the plurality of REF2 nodes comprising a first REF2 node and a second REF2 node, the second voltage reference configured to regulate the voltage level of the first REF2 node relative to the voltage level of the second REF2 node or to regulate the voltage level of the first REF2 node and the voltage level of the second REF2 node relative to the voltage level of the first shared reference node or a second shared reference node; successive-approximation circuitry comprising an array of capacitors and configured in a subconversion operation to switch at least one of the array of capacitors between different REF1 nodes such that a first charge is drawn from the first REF1 node and a second charge is injected into the second REF1 node; and compensation circuitry comprising at least one compensation capacitor and configured, in a precharge operation prior to the subconversion operation, to connect the at least one compensation capacitor between the first and second REF2 nodes so that the at least one compensation capacitor stores a compensation charge, and, in the subconversion operation, to disconnect the at least one compensation capacitor from at least the first REF2 node and connect the at least one compensation capacitor between the first and second REF1 nodes so that a third charge is injected into the first REF1 node and a fourth charge is drawn from the second REF1 node.

According to any of the fifth to seventh aspects, by disconnecting the at least one compensation capacitor from a regulated node of the second voltage reference, REF2, and connecting the at least one compensation capacitor between nodes of the first voltage reference, REF1, the requirements of the second voltage reference are not as critical or can be relaxed since at least that regulated node is not connected to the compensation circuitry in the subconversion operation. This allows for a second voltage reference to be of lower power consumption, e.g. relative to the first voltage reference, saving space and power.

In an eighth aspect of the present invention there is provided integrated circuitry, such as an IC chip, comprising ADC circuitry according to any of the above ADC circuitry aspects.

Also envisaged are method aspects corresponding to the ADC circuitry aspects.

BRIEF DESCRIPTION OF THE DRAWINGS

Reference will now be made, by way of example, to the accompanying drawings, of which:

FIG. 15 is a schematic diagram representing the further single-ended SAR ADC, useful for understanding how a corresponding technique can be applied;

DETAILED DESCRIPTION

Figure 2:
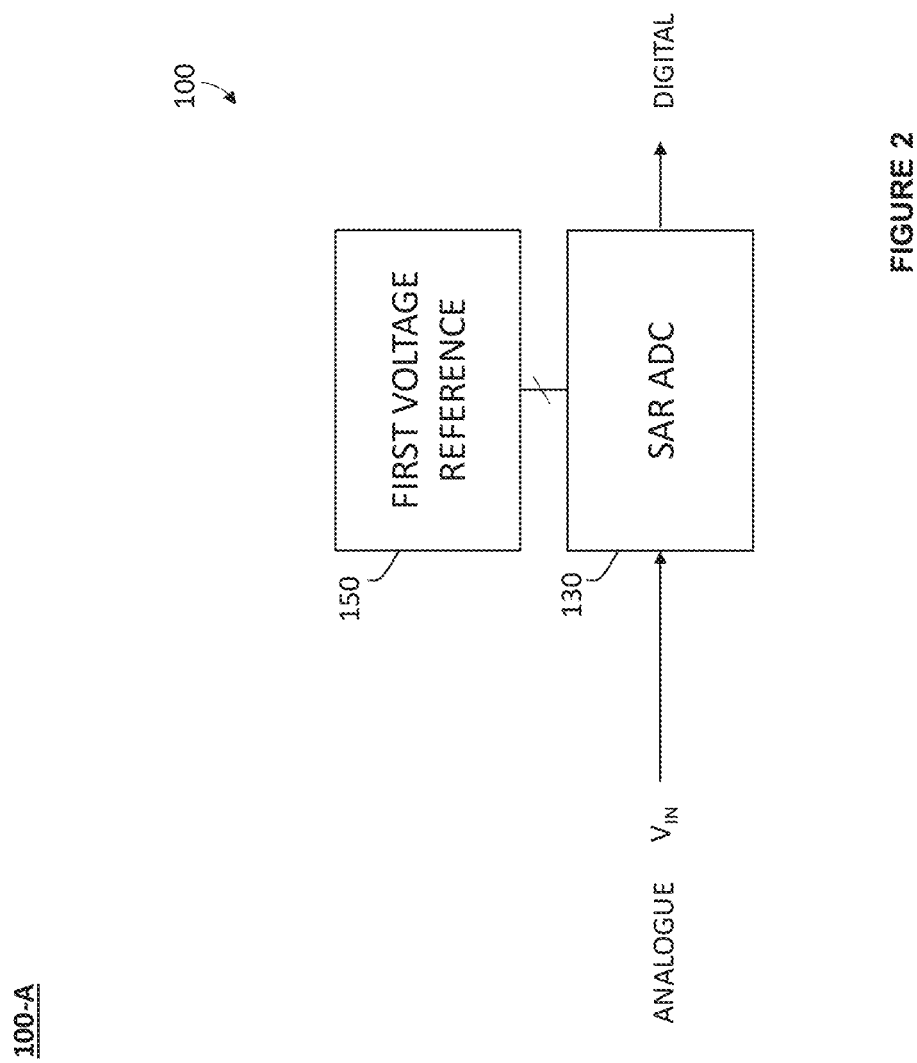
FIG. 2, as mentioned above, is a schematic diagram of the previously-considered SAR ADC circuitry, presented as a block diagram.
Figure 3:
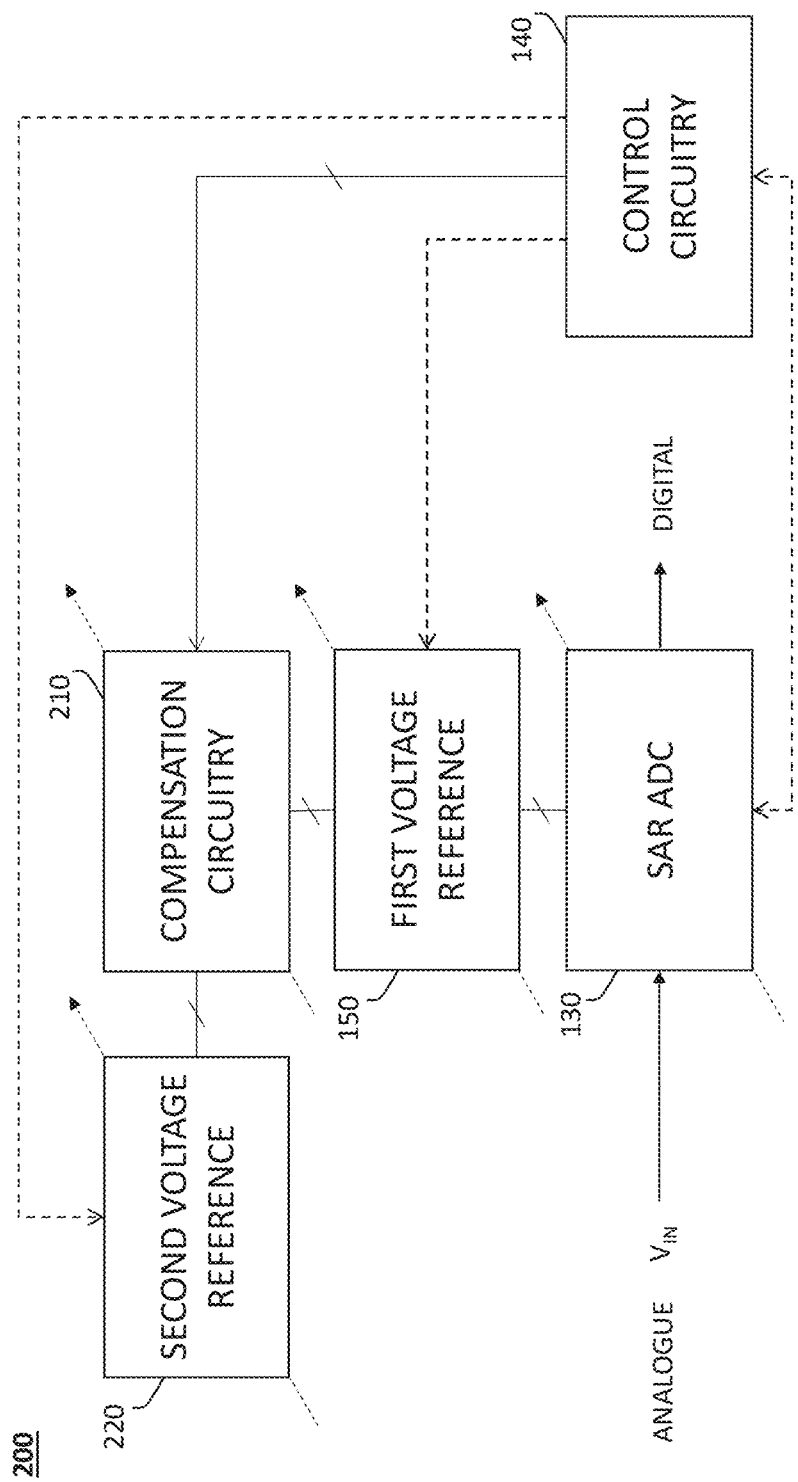
FIG. 3 is a schematic block diagram of an ADC unit embodying the present invention.

FIG. 3 is a schematic block diagram of an ADC unit (sub-ADC unit) 200 embodying the present invention. The ADC unit 200 is similar to the ADC unit 100, and has thus been represented in FIG. 3 in a similar manner as in FIG. 2.

ADC unit 200 comprises the previously considered circuitry of ADC unit 100, and additionally comprises compensation circuitry 210, connected to the first voltage reference 150, a second voltage reference 220 connected to the compensation circuitry 210, and control circuitry 140 connected to the SAR ADC 130 and compensation circuitry 210, and optionally to the first voltage reference 150 and the second voltage reference 220.

Control circuitry 140 is configured to output a control signal to the compensation circuitry 210 to control its operation, for example to synchronize or align its operation with subconversion operations of the SAR ADC 130. Control circuitry 140 may output a plurality of control signals to compensation circuitry 210, as shown by a grouped connection between the control circuitry and the compensation circuitry 210, indicating one or more connections.

Optionally, control circuitry 140 is further configured to output control signals to the first and second voltage references. These control signals may be capable of adjusting output voltages or other properties of the first and second voltage references. Further optionally, control circuitry 140 is configured to output a control signal to the SAR ADC 130. This control signal may be capable of controlling the capacitance of the variable capacitors seen in FIG. 1, as explained previously.

Other example embodiments may combine the function of the control circuitry 140 and the SAR control unit 180. Functionality of both the control circuitry 140 and SAR control unit 180 may be represented simply as a SAR control unit 180, with additional control signal outputs, or simply as control circuitry 140, with the additional SAR control functionality included.

Figure 1:
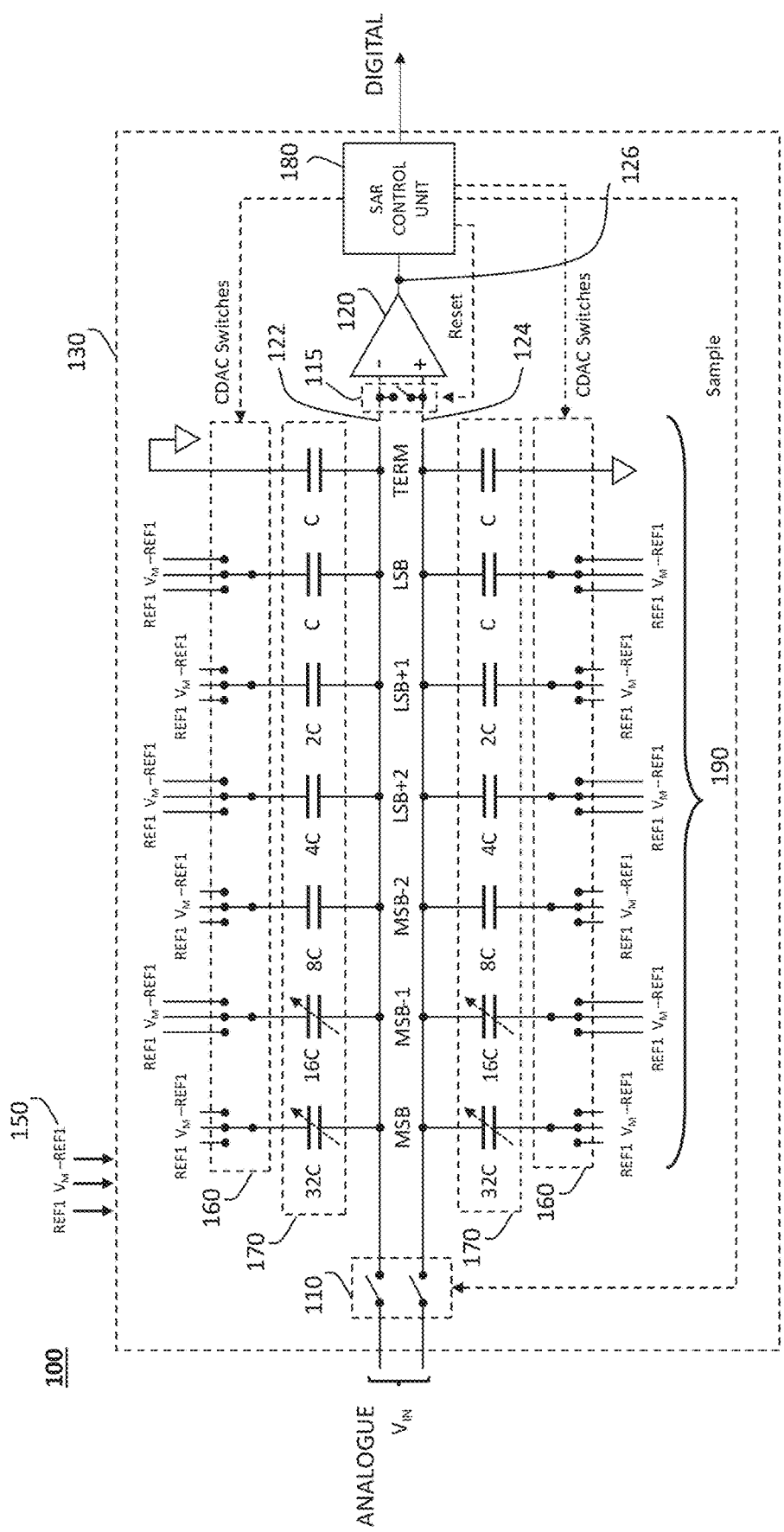
FIG. 1, as mentioned above, is a schematic diagram of previously-considered SAR ADC circuitry 100.

Similarly to the first voltage refence 150 as described in relation to FIG. 1, the second voltage reference 220 may have a plurality of second voltage reference nodes, or REF2 nodes, as shown by a grouped connection between the second voltage reference 220 and the compensation circuitry 210, indicating one or more connections.

The plurality of REF2 nodes have different defined voltage levels. The plurality of REF2 nodes may comprises at least a first REF2 node and a second REF2 node. For example, the plurality of REF2 nodes may comprise a positive second reference voltage and a negative second reference voltage, or a positive second reference voltage and a ground voltage, or a positive second reference voltage, a middle second reference voltage and a negative second reference voltage.

The first voltage reference 150 is configured to regulate the voltage level of at least the first REF1 node and the second voltage reference 220 is configured to regulate the voltage level of at least the first REF2 node. The first voltage reference 150 may be configured to regulate the voltage level of the first REF1 node relative to the voltage level of the second REF1 node (which may for example be a ground node). The second voltage reference 220 may be configured to regulate the voltage level of the first REF2 node relative to the voltage level of the second REF2 node (which may for example be a ground node). Indeed, the second REF1 node and the second REF2 node may be connected together and constitute a shared reference node, such as a ground node. This may simplify the design of the first voltage reference and the second voltage reference, or may be beneficial in a single-ended example, as explained in relation to additional embodiments with reference to FIGS. 13 to 15.

The first voltage reference may be configured to regulate the voltage level of the first REF1 node and the voltage level of the second REF1 node relative to the voltage level of a shared reference node. The second voltage reference may be configured to regulate the voltage level of the first REF2 node and the voltage level of the second REF2 node relative to the voltage level of that shared reference node, or indeed of another shared reference node. Such a configuration will be treated as a running example.

The SAR ADC unit 130, the first voltage reference 150, compensation circuitry 210 and second voltage reference 220 are shown as optionally being variable (or controllable or programmable), as illustrated by the dashed arrows passing through the respective blocks. In some arrangements, none of those blocks 130, 150, 210, 220 is variable, in some arrangements one of those blocks 130, 150, 210, 220 is variable and in some arrangements more than one of those blocks 130, 150, 210, 220 is variable.

Variability of the SAR ADC 130 is due to the presence of optionally variable capacitors present in the plurality of capacitors 170 of FIG. 1. Variability of the first voltage reference 150 is due to the ability to adjust the voltage levels of the plurality of REF1 nodes by the control circuitry 140. Variability of the second voltage reference 220 is due to the ability to adjust the voltage levels of the plurality of REF2 nodes by the control circuitry 140. Variability of the compensation circuitry 220 is explained in detail later in the description.

Details of the arrangement and operation of the compensation circuitry 210 will be described with reference to FIGS. 4 to 7, in line with the running example.

Figure 4:
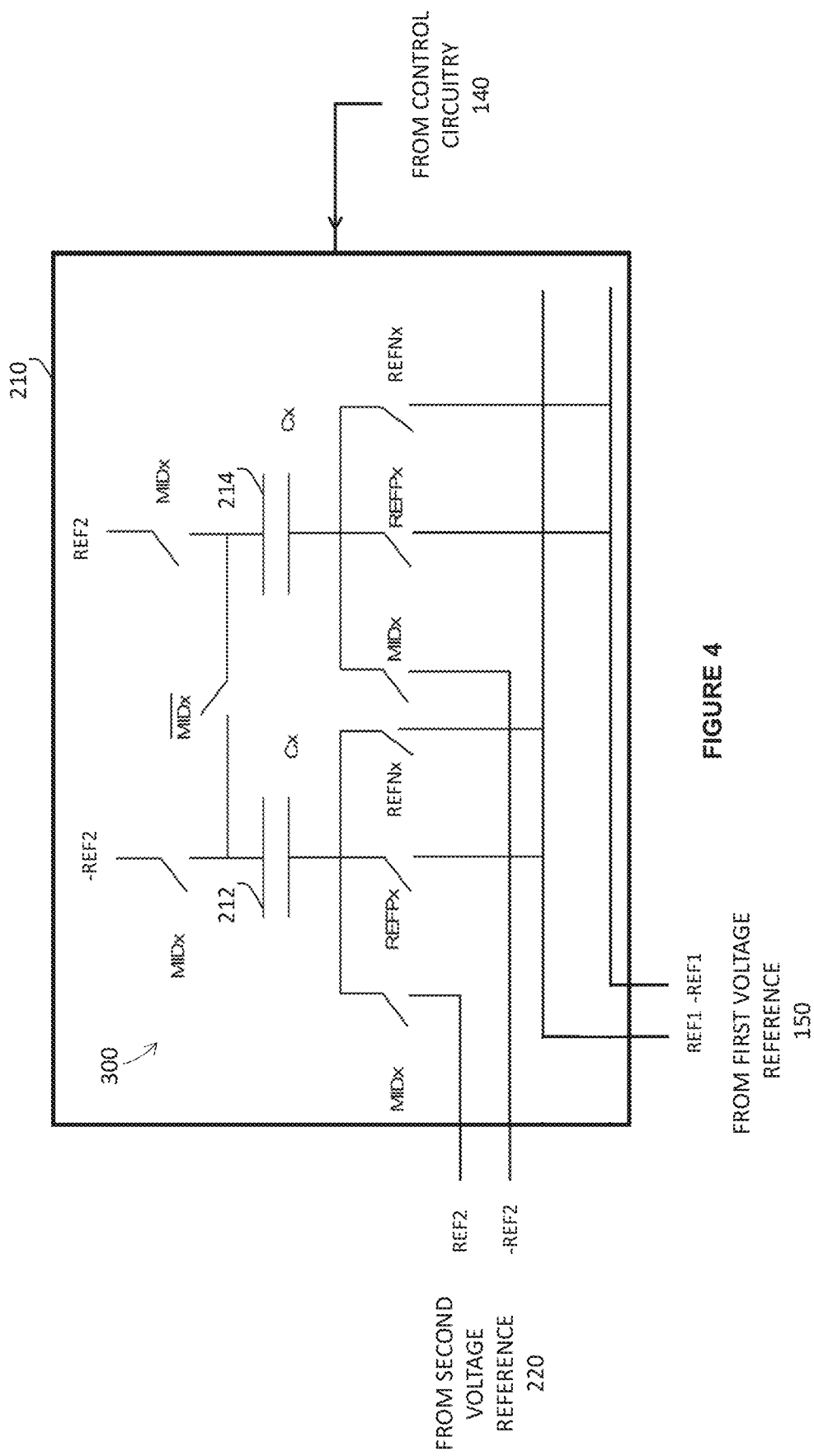
FIG. 4 is a schematic circuit diagram of an example configuration of compensation circuitry.

FIG. 4 is a schematic circuit diagram of an example configuration 300 of the compensation circuitry 210. In this configuration, compensation circuitry 210 is configured to connect to the first voltage reference 150, shown as a plurality of connections, the plurality of connections comprising a connection to a first REF1 node, REF1, and a connection to a second REF1 node, -REF1. The compensation circuitry is also configured to connect to the second voltage reference 220, shown as a plurality of connections, the plurality of connections comprising a connection to a first REF2 node, REF2, and a connection to a second REF2 node, -REF2. The compensation circuitry 210 is also configured to connect to control circuitry 140.

Example configuration 300 comprises a plurality of switches configured to be controlled by a plurality of control signals. The control signals include MIDx, REFPx, REFNx and MIDx_bar (/MIDx), i.e. the inverse of MIDx. These control signals are input to the compensation circuitry 210 from the control circuitry 140.

The compensation circuitry 210 comprises at least one compensation capacitor. In the example configuration 300 of FIG. 4, two compensation capacitors are shown, a first compensation capacitor 212 and a second compensation capacitor 214.

The first compensation capacitor 212 has a first terminal connected to the second REF2 node -REF2 via a switch controlled by control signal MIDx. The first compensation capacitor 212 has a second terminal connected to: the first REF2 node REF2 via a switch controlled by control signal MIDx; the first REF1 node REF1 via a switch controlled by control signal REFPx; and the first REF1 node REF1 via a switch controlled by control signal REFNx.

The second compensation capacitor 214 has a first terminal connected to the first REF2 node REF2 via a switch controlled by control signal MIDx. The second compensation capacitor 214 has a second terminal connected to: the second REF2 node −REF2 via a switch controlled by control signal MIDx; the second REF1 node −REF1 via a switch controlled by control signal REFPx; and the second REF1 node −REF1 via a switch controlled by control signal REFNx.

The first terminal of the first compensation capacitor and the first terminal of the second compensation capacitor are connected together via a switch controlled by control signal MIDx_bar.

In the example configuration 300, REFPx and REFNx control switches connecting the second terminal of the at least one compensation capacitor to the same reference node. That is, in the case of the first compensation capacitor 212, both REFPx and REFNx control switches that connect the second terminal of the first compensation capacitor to the first REF1 node REF1. Thus, one of those switches (and its control signal) may be considered redundant and omitted in some arrangements. It is clear that either one of the switches may define a path between the given reference node (i.e. REF1) and the second terminal of the at least one compensation capacitor. The compensation circuitry may be implemented in such a way as to avoid the need for further control signal processing logic in the event where control signals may need to be processed or inverted, or where existing control signals may be used for the purpose of controlling the switches.

Other example configurations of compensation circuitry 210 may include further compensation capacitors, and these further compensation capacitors may require additional control signals, such as REFNx, to connect the at least one compensation capacitor between additional voltage references if needed (e.g. in the case of multiple first voltage references, where each compensation capacitor is connected to a different first voltage reference 150).

In the example configuration 300, either of REFPx and REFNx may be used in order to control the switching inside the compensation circuitry. For simplicity, only REFPx is considered in this explanation. REFNx is not considered in this example, and the switches controlled by control signal REFNx remain open at all times (or may be omitted as above). REFNx could be used in place of REFPx, since the switches controlled by REFNx would result in the same connections as the switches controlled by REFPx.

Operation of the compensation circuitry 210 in the example configuration 300 will be explained with reference to FIGS. 5A and 5B, detailing a pre-charge operation and a subconversion operation respectively.

Figure 5A:
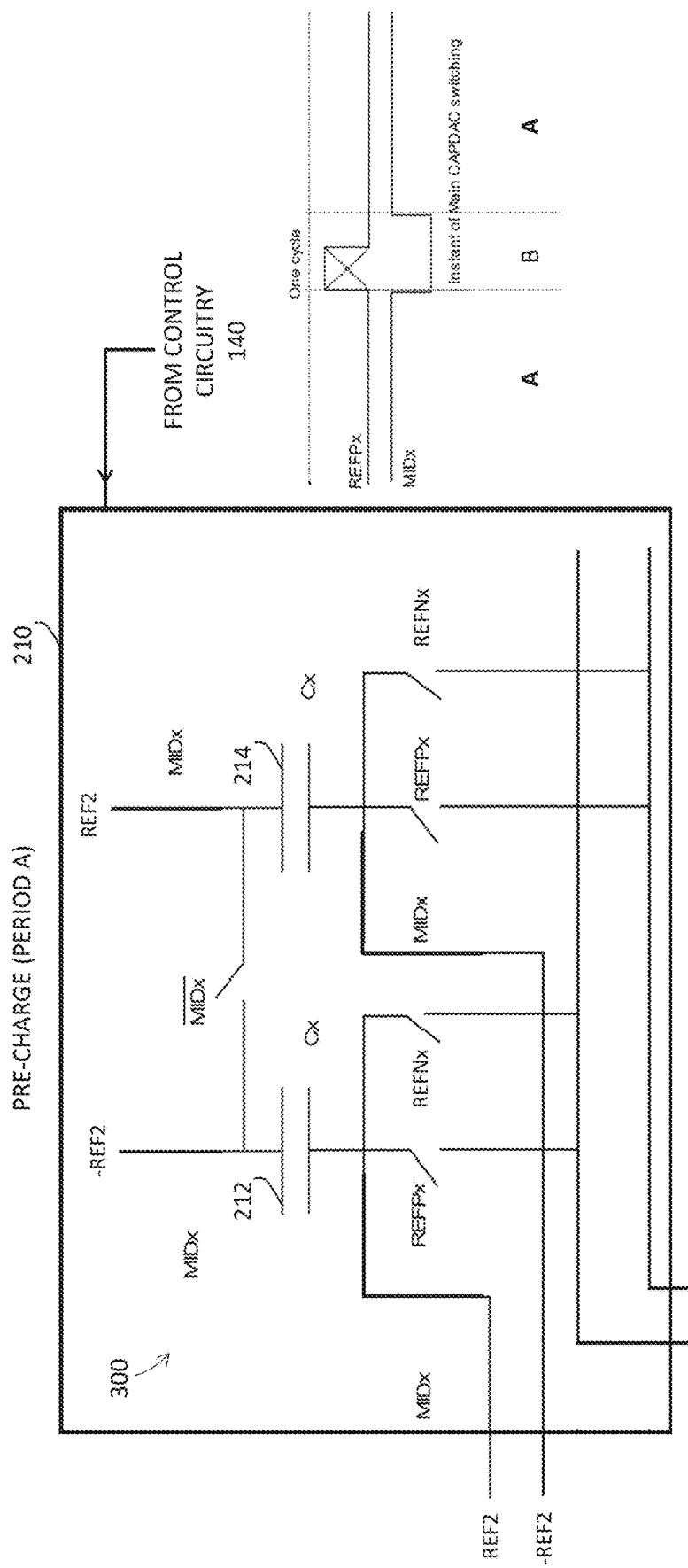
FIG. 5A is a schematic circuit diagram of the compensation circuitry of FIG. 4 in a pre-charge operation.

FIG. 5A is a schematic circuit diagram of the circuitry 300 of FIG. 4 in the pre-charge operation.

To the right of the compensation circuitry, a timing diagram is shown, and illustrates the values of the control signals REFPx and MIDx during the pre-charge operation. For simplicity, only REFPx is shown on the timing diagram, for the reasons explained above. The pre-charge operation is shown on the timing diagram as period A, where the value of REFPx is low (LO), or digital 0, and the value of MIDx is high (HI), or digital 1. A value of HI or digital 1 closes a switch. A value of LO or digital 0 opens a switch.

In the pre-charge operation prior to a subconversion operation, the compensation circuitry 210 is configured to connect the at least one compensation capacitor between different REF2 nodes so that the at least one compensation capacitor stores a compensation charge.

This is demonstrated in FIG. 5A, where the switches controlled by control signal MIDx appear closed, and the switches controlled by control signal REFPx appear open. Additionally, the switch controlled by control signal MIDx_bar appears open. This results in the first compensation capacitor 212 being connected between the second REF2 node −REF2 and the first REF2 node REF2, and the second compensation capacitor 214 being connected between the first REF2 node REF2 and the second REF2 node −REF2.

Prior to the end of the pre-charge operation, the value of MIDx falls to low, and the switches controlled by MIDx appear open, and the switch controlled by MIDx_bar appears closed (effectively, connecting the capacitors 212 and 214 together in series).

Figure 5B:
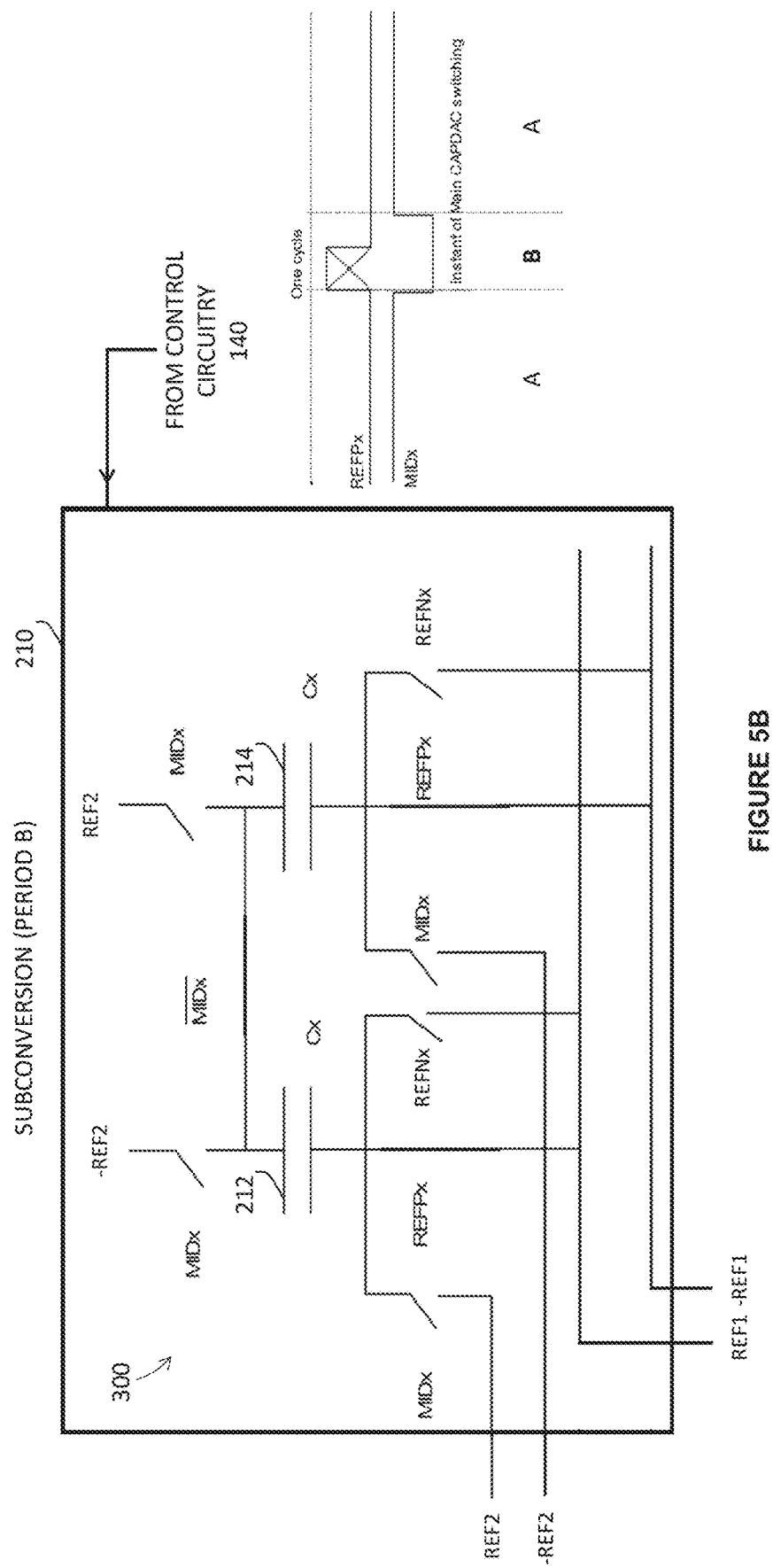
FIG. 5B is a schematic circuit diagram of the compensation circuitry of FIG. 4 in a subconversion operation.

FIG. 5B is a schematic circuit diagram of the circuitry 300 of FIG. 4 in the subconversion operation.

The subconversion operation is shown on the timing diagram as period B, where the value of REFPx is high (HI), or digital 1, and the value of MIDx is low (LO), or digital 0.

In the subconversion operation, the compensation circuitry 210 is configured to connect the at least one compensation capacitor between different REF1 nodes so that a charge is injected into one of those REF1 nodes and another charge is drawn from the other one of those REF1 nodes.

This is demonstrated in FIG. 5B, where the switches controlled by control signal MIDx appear (or remain) open, and the switches controlled by control signal REFPx appear closed. Additionally, the switch controlled by control signal MIDx_bar appears (or remains) closed. This results in the first terminal of the first compensation capacitor 212 being connected to the first terminal of the second compensation capacitor 214 (connecting the capacitors 212 and 214 together in series, as before). The second terminal of the first compensation capacitor 212 is connected to the first REF1 node REF1, and the second terminal of the second compensation capacitor 214 is connected to the second REF1 node −REF1. This has the effect of connecting both compensation capacitors in series between the first REF1 node REF1 and the second REF1 node −REF1.

After the subconversion operation has completed, the circuit returns to the pre-charge operation. As shown in the timing diagram, the switches controlled by control signal REFPx open before the switches controlled by MIDx and MIDx_bar change state.

In order to better understand the significance of the operation of the compensation circuitry as described with reference to FIGS. 5A and 5B, reference will be made to FIG. 6.

Figure 6:
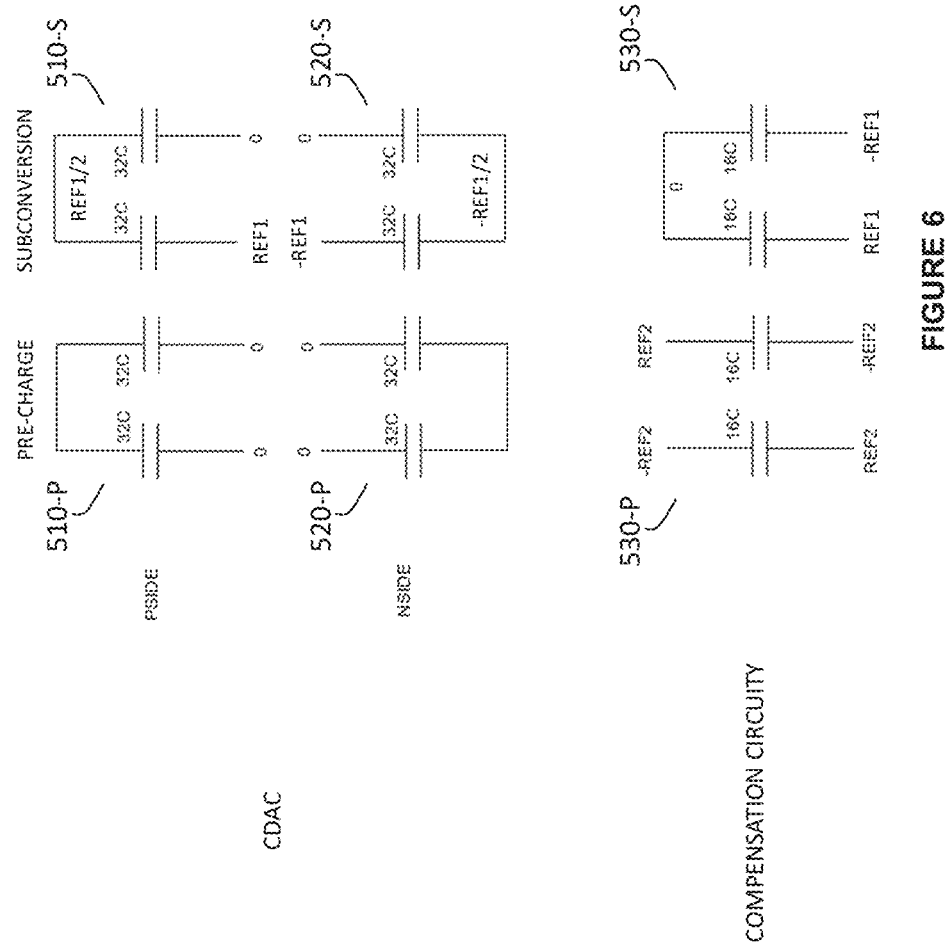
FIG. 6 is a schematic diagram presenting simplified, equivalent capacitance circuits of the CDAC and the compensation circuitry.

FIG. 6 is a schematic diagram presenting simplified, equivalent capacitance circuits of the CDAC 190 and the compensation circuitry 210 to allow for ease of explanation of the compensation methodology.

Circuits 510-P and 520-P show the CDAC 190 in a given pre-charge operation, and circuit 530-P shows the compensation circuitry 210 in the same pre-charge operation. Circuits 510-S and 520-S show the CDAC 190 in a subsequent subconversion operation, and circuit 530-S shows compensation circuitry 210 in the same subconversion operation.

Circuits 510-P and 510-S are equivalent capacitance circuits of the "positive" PSIDE capacitors (i.e. the capacitors connected to the positive input terminal of the comparator), in the pre-charge and subconversion operations respectively. Circuits 520-P and 520-S show equivalent capacitance circuits of the "negative" NSIDE capacitors (i.e. the capacitors connected to the negative input terminal of the comparator), in the pre-charge and subconversion operations respectively. Circuits 510-P and 510-S, and circuits 520-P and 520-S, are collectively a representation of the CDAC 190 during SAR operations (i.e. before and during the indicated subconversion operation).

Circuits 530-P and 530-S show equivalent capacitance circuits of the compensation capacitors of the compensation circuitry 210, as explained with reference to FIGS. 5A and 5B. Circuits 530-P and 530-S are collectively a representation of the compensation circuitry 210 during the same SAR operations (i.e. before and during the indicated subconversion operation).

The circuits 510-P, 520-P and 530-P, representing the pre-charge operation, will first be considered.

Circuit 510-P shows two 32C capacitors connected in parallel. First terminals of both 32C capacitors are connected to the positive input terminal of the comparator (and thus shown as being connected together), and second terminals of the capacitors are both connected to 0, as an example value of the middle first voltage reference $V_M$ as mentioned earlier, representing the initial voltage reference value before any switching operation of the CDAC 190, as described in relation to FIG. 1. The first 32C capacitor represents the MSB capacitor in the CDAC 190, and the second 32C capacitor represents the remaining capacitors (i.e. 16C+8C +4C+2C+C+C) grouped together.

Circuit 520-P shows an equivalent representation of circuit 510-P on the "negative" side of the CDAC 190, and shows an identical arrangement to circuit 510-P, although shown flipped upside-down. First terminals of both 32C capacitors are connected to the negative input terminal of the comparator (and thus shown as being connected together), and second terminals of the capacitors are both connected to 0, again as an example value of the middle first voltage reference $V_M$, representing the initial voltage reference value before any switching operation of the CDAC 190.

Circuit 530-P shows the capacitors of the compensation circuitry 210 in the pre-charge operation, in line with FIG. 5A. A first 16C capacitor, representing the first compensation capacitor 212, is shown connected between the second REF2 node −REF2 and the first REF2 node REF2. A second 16C capacitor, representing the second compensation capacitor, is shown connected separately between the first REF2 node REF2 and the second REF2 node −REF2. Both compensation capacitors are charged to collectively store a compensation charge.

During the subsequent MSB subconversion operation, the SAR ADC 130 is configured to switch at least one of the array of capacitors 160 between different REF1 nodes such that a first charge is drawn from a first REF1 node and a second charge is injected into a second REF1 node, as mentioned earlier in connection with FIG. 1. This switching is based on the decision of the comparator during the SAR process.

This is demonstrated by referring to circuit 510-P and then to 510-S. In this example, the "positive" MSB 32C capacitor is switched from the middle first voltage reference 0 to the first REF1 node REF1. As a result, the voltage level seen at the connection between the two capacitors (also representing the positive input terminal to the comparator) increases (to REF1/2). This switching has the effect of drawing the first charge from the REF1 node, where this first charge may be calculated as:

16*C*REF1

At the same time, an inverse switching operation happens in circuit 520-S. The "negative" MSB 32C capacitor is switched from the middle first voltage reference 0 to the second REF1 node −REF1. As a result, the voltage level seen at the connection between the two capacitors (also representing the negative input terminal to the comparator) decreases (to −REF1/2). This has the effect of drawing the second charge from the second REF1 node −REF1 node, where this second charge may be calculated as.

−16*C*REF1

Negative charge is drawn, meaning the second charge is injected into the second REF1 node −REF1.

Now, the compensation circuitry will be considered. Due to the switching of the compensation circuitry 210 (as described in connection with the implementation 300 of FIGS. 5A and 5B), in the subconversion operation the first terminals of the charged compensation capacitors are connected together, the second terminal of the first compensation capacitor is connected to the first REF1 node REF1, and the second terminal of the second compensation capacitor is connected to the second REF1 node −REF1. As a result, the voltage level seen at the connection between the two compensation capacitors becomes 0 (since the two capacitors have the same capacitance value 16C as one another). A charge is therefore drawn from the first and second REF1 nodes by the compensating capacitors.

In particular, a third charge is drawn from the first REF1 node REF1, and may be calculated as:

(16*C*REF1)−(16*C*2*REF2)

This can be simplified to:

16*C(REF1−2REF2)

In the case where REF1=REF2, this simplifies to:

−16*C*REF1

Negative charge is drawn, meaning the third charge is injected into the first REF1 node REF1. In this example, for convenience, the third charge is therefore equal in magnitude and opposite in polarity to the first charge.

Similarly, a fourth charge is drawn from the second REF1 node −REF1, and may be calculated as:

−(16*C*REF1)+(16*C*2*REF2)

This can be simplified to:

16*C(2REF2−REF1)

In the case where REF1=REF2, this simplifies to:

16*C*REF1

Positive charge is drawn. That is, the fourth charge is drawn from the second REF1 node-REF1. In this example, for convenience, the fourth charge is therefore equal in magnitude and opposite in polarity to the second charge.

Put another way, compensation circuitry 210 comprising at least one compensation capacitor is configured, in the subconversion operation, to connect the at least one compensation capacitor between the first and second REF1 nodes so that a third charge is injected into the first REF1 node and a fourth charge is drawn from the second REF1 node.

Looking back at FIGS. 4, 5A and 5B, compensation circuitry 210 comprises at least one compensation capacitor and is configured, in a precharge operation prior to the subconversion operation, to connect the at least one compensation capacitor between different REF2 nodes so that the at least one compensation capacitor stores a compensation charge. In the implementation 300, the first compensation capacitor 212 and the second compensation capacitor 214 are thus charged to collectively store a compensation charge.

In the subconversion operation, the compensation circuitry 210 is configured to connect the at least one compensation capacitor between different REF1 nodes so that charge is injected into and drawn from different REF1 nodes. In some arrangements, the compensation circuitry 210 is configured, in the subconversion operation, to disconnect the at least one compensation capacitor from at least the first REF2 node and connect the at least one compensation capacitor between the first and second REF1 nodes. In some arrangements, the compensation circuitry 210 is configured, in the subconversion operation, to disconnect the at least one compensation capacitor from the first and second REF2 nodes and connect the at least one compensation capacitor between the first and second REF1 nodes. In the implementation 300, this results in the third charge and fourth charges being injected into and drawn from the connected first and second REF1 nodes, respectively.

By compensating for the first and second charges with the third and fourth charges, the first voltage reference 150 ideally sees no net charge drawn or injected. Of course, the example above demonstrates the case of no net charge drawn or injected, as an example. In some arrangements it may be that the third and fourth charges at least partly compensate for the first and second charges, respectively.

During the switching operation of the CDAC 190, and ignoring the compensation circuitry 210 for now, the drawing and injecting of charge causes the voltage level(s) of the first voltage reference 150 to fluctuate. This can affect the voltage seen by components connected to the first voltage reference, and can introduce noise/distortion (effectively, inaccuracies in voltage levels seen or charges drawn). While, due to regulation, the voltage level(s) of the first voltage reference 150 will eventually return to stable values, the fluctuations can affect subsequent subconversion operations taking place soon afterwards, such as the subsequent MSB-1 subconversion operation which will also use the first voltage reference 150. In some arrangements, it may be that the frequency of operation is limited, since time must pass for the voltage level to return to the stable value before other subconversion operations may take place.

Figure 11:
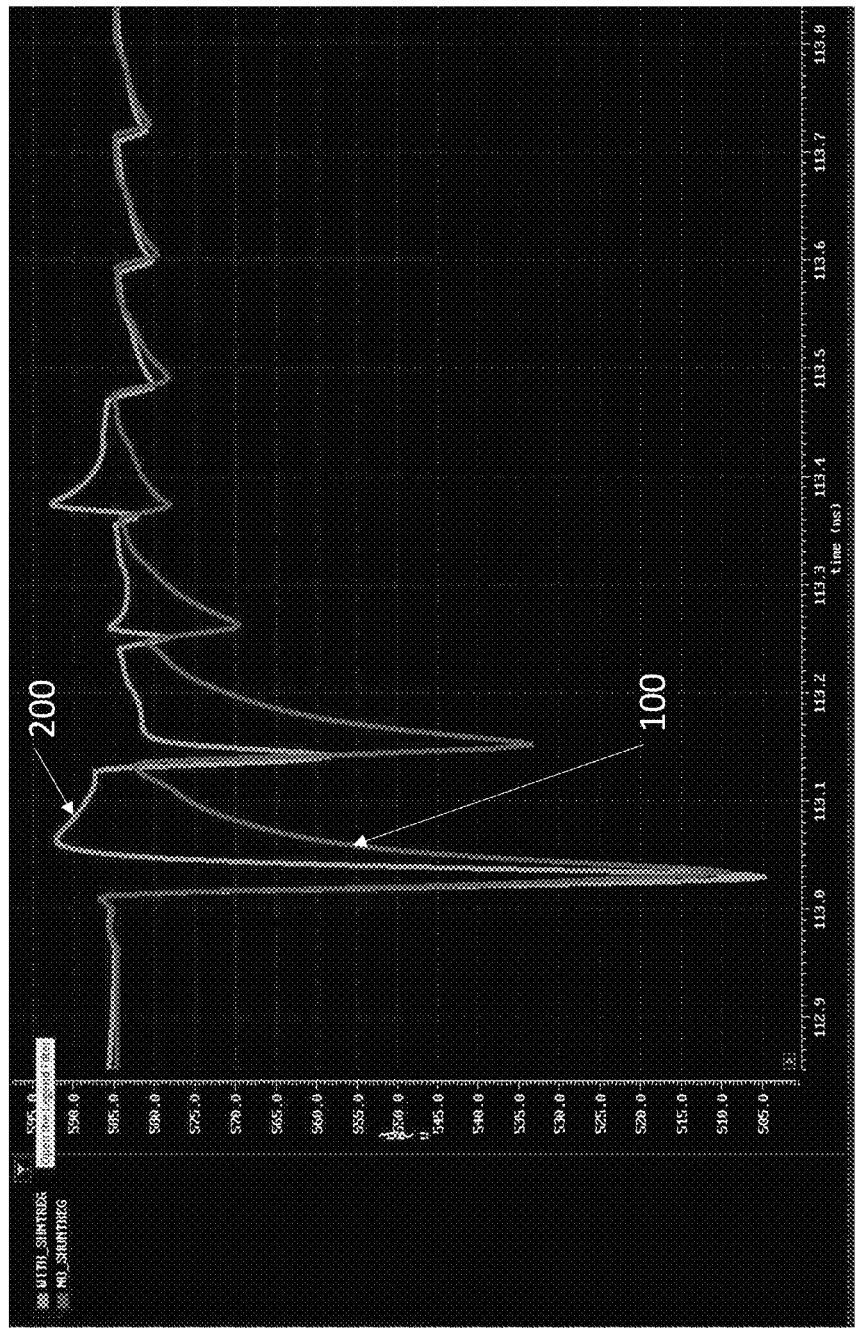
FIG. 11 is a graph showing settling time for the first voltage reference of the ADC unit embodying the present invention in comparison with the previously considered ADC unit.
Figure 12:
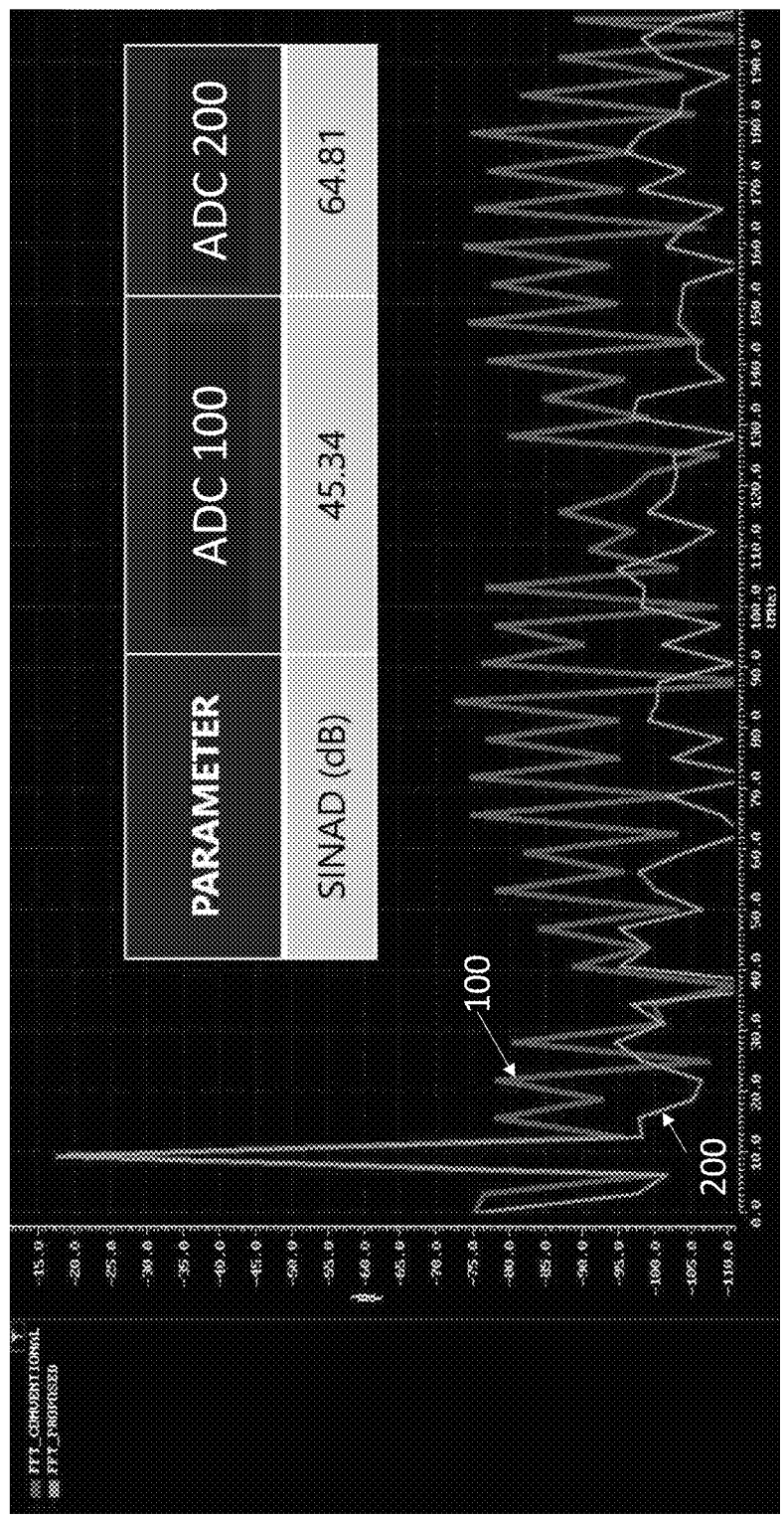
FIG. 12 is a graph showing the effect on noise performance of the ADC unit embodying the present invention in comparison with the previously considered ADC unit.

By compensating for the charges drawn/injected with the compensation circuitry 210, the time taken for the voltage level(s) of the first voltage reference 150 to return to close to a stable value (or to an acceptable value) can be reduced dramatically, and speed of operation can be increased. Noise seen on the first voltage reference 150 (and thus in circuitry relying on the first voltage reference 150) can also be reduced. These effects are shown in FIGS. 11 and 12 as described later.

By connecting the at least one compensation capacitor between the first and second REF1 nodes during the subconversion operation, and disconnecting the at least one compensation capacitor from the first and second REF2 nodes, the settling time of the first and second REF2 nodes does not impact the settling time of the first voltage reference 150. This also allows for the second voltage reference 220 to be of lower power or "strength" than the first voltage reference 150, since the period of a pre-charge operation may for example be longer than the period of the subconversion operation, saving significant amounts of power.

Where the at least one compensation capacitor remains connected to one of the first and second REF2 nodes during the pre-charge and subconversion operations, voltage fluctuation may also be seen at second voltage reference 220 (although this may be limited if the node to which the at least one compensation capacitor remains connected is e.g. a common ground node). This may mean the second voltage reference also needs to have a fast (i.e., low) settling time, which may require the use of a stronger second voltage reference 220. By instead disconnecting from the REF2 nodes, the requirements of the second voltage reference are not as critical since it is not connected to the compensation circuitry 210 in the subconversion operation.

While the values of the capacitors shown in FIG. 6 are shown as 32C and 16C, these are merely examples in order to explain the operation of the compensation circuitry following the example ADC unit 100 shown in FIG. 1. While the values of REF2 are equal to the values of REF1 in the above example, these are merely examples in order to simplify the explanation of the compensation circuitry.

While FIGS. 4, 5A, 5B and 6 have been directed at the subconversion operation relating to the 32C capacitor of the CDAC 190, i.e. the MSB, similar subsequent pre-charge and subconversion operations may apply to the other weighted capacitors. The compensation in respect of these capacitors may use the same compensation capacitors as those used for the MSB, or there may be separate, independent compensation capacitors configured to compensate for a corresponding weighted capacitor, or bit. The same compensation capacitors may be used, and the charge stored may be adjusted, either by controlling or programming the compensation capacitance, or by controlling the voltage of the second voltage reference (or equivalent third voltage reference nodes) used to charge the compensation capacitors concerned. Thus, the circuitry 300 of FIG. 4 could be provided per subconversion operation or bit within the compensation circuitry 210, with each set operated in an equivalent way to that explained in connection with FIGS. 5A, 5B and 6 for its subconversion operation (and preceding pre-charge operation).

It will be understood that the value of the capacitors in the CDAC 190, the value of the compensation capacitors in the compensation circuitry 210 and the first and second voltage references (and any of their respective nodes) may take any value, and an ADC unit 200 may be designed appropriately in order for the first and second charges to be substantially the same as the third and fourth charges, respectively, or vice versa. Further, the compensation may be at least partial (rather than ideal) as mentioned earlier.

Figure 7:
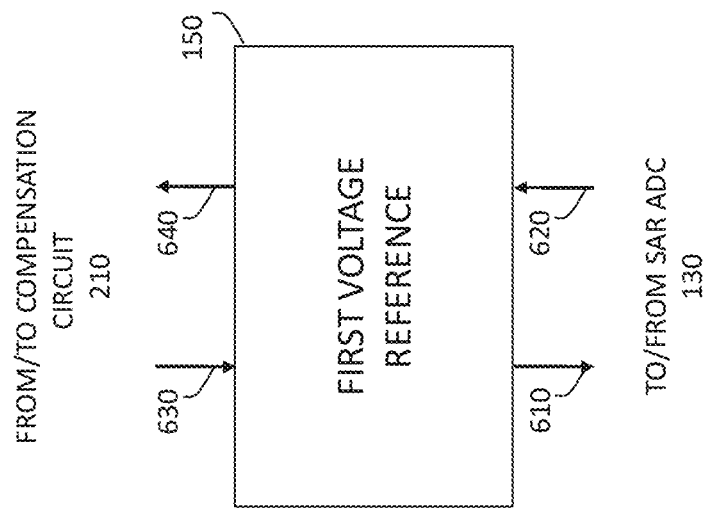
FIG. 7 shows a schematic representation of the charges drawn from or injected into the first voltage reference during a given subconversion operation.

FIG. 7 shows a schematic representation 600 of the charges drawn from or injected into the first voltage reference 150 during a given subconversion operation, such as the MSB subconversion operation focused on above.

Arrow 610, that points outward from the first voltage reference 150 towards the SAR ADC 130, represents the first charge being drawn by the CDAC 190. Arrow 620, that points inward to the first voltage reference 150 from the SAR ADC 130 represents the second charge being injected into the first voltage reference 150. Arrow 630, that points inward to the first voltage reference 150 from the compensation circuitry 210, represents the third charge being injected into the first voltage reference 150. Arrow 640, that points outward from the first voltage reference 150 towards the compensation circuitry 210 represents the fourth charge being drawn by the compensation circuitry 210.

Figure 8:
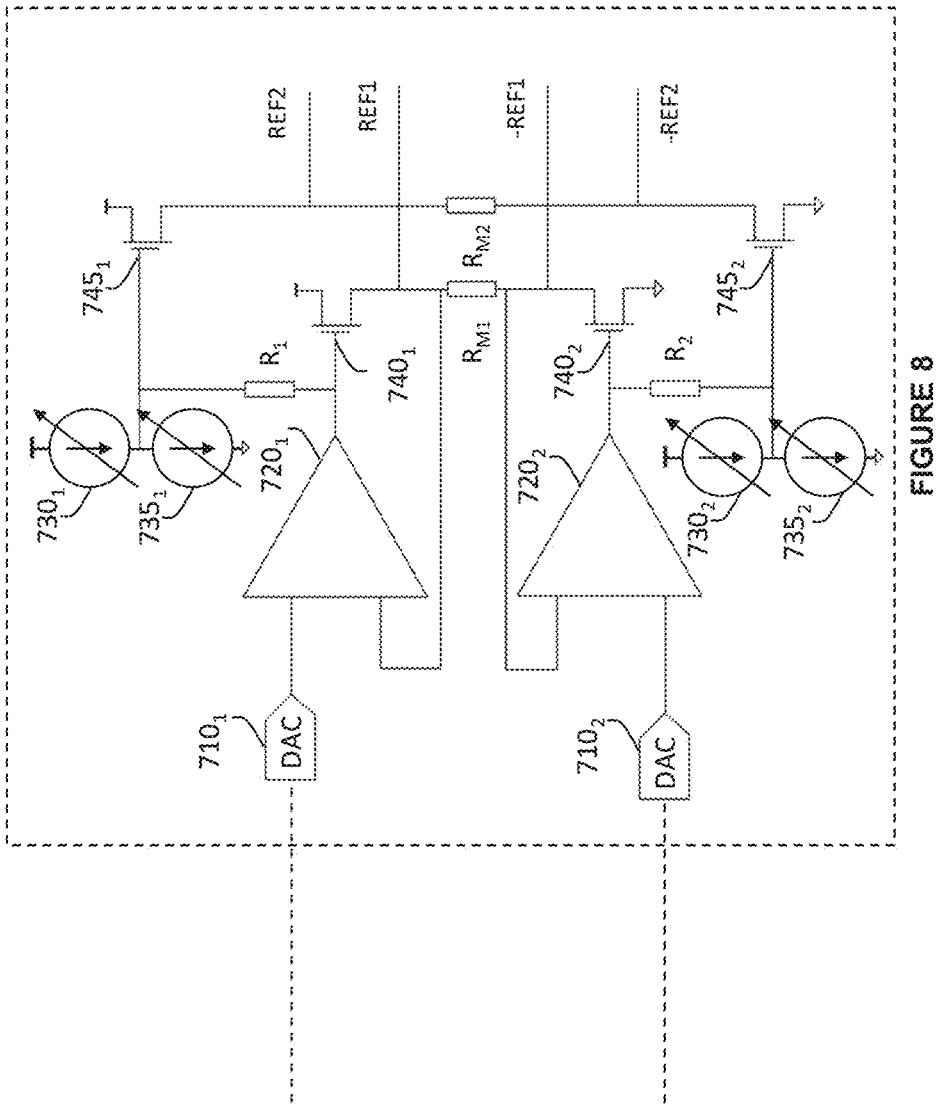
FIG. 8 is a schematic diagram of voltage generation circuitry.

FIG. 8 is a schematic diagram of voltage generation circuitry (voltage reference circuitry) 700 which may serve as the first and second voltage references 150 and 220. Voltage generation circuitry 700 may therefore be implemented in the ADC unit 200.

The voltage generation circuitry 700 comprises differential circuitry providing a plurality of first voltage reference nodes, REF1 and −REF1, and a plurality of second voltage reference nodes, REF2 and −REF2.

The circuitry 700 can effectively be considered as two channels or sides, where each channel or side is largely the same in design. The two channels can be considered to comprise a positive channel and a negative channel. The positive channel defines an output for one of the first voltage reference nodes, REF1, and defines an output for one of the second voltage reference nodes, REF2. The negative channel defines an output for another one of the first voltage reference nodes, −REF1, and defines an output for another one of the second voltage reference nodes, −REF2.

The voltage generation circuit 700 comprises a first DAC 710$_1$ connected to a first input terminal of a first operational amplifier (OPAMP) 720$_1$. An output of the OPAMP 720$_1$ is connected to a gate terminal of a transistor 740$_1$. A source terminal of the transistor 740$_1$ is connected to a voltage source or voltage supply. A drain terminal of the transistor 740$_1$ is connected to a first terminal of a first middle resistor $R_{M1}$. The drain terminal of the transistor 740$_1$ is also connected in a feedback arrangement to the second input terminal of the first OPAMP 710$_1$. The drain terminal of the transistor 740$_1$ also defines an output for one of the first voltage reference nodes, REF1.

Resistor $R_1$ is connected between the gate terminal of the transistor 740$_1$ and a gate terminal of a transistor 745$_1$.

A first controllable current source 730$_1$ is connected between a voltage supply and a second controllable current source 735$_1$. The second controllable current source is connected between the first controllable current source 730$_1$ and a ground terminal. A node between the two controllable current sources 730$_1$ and 735$_1$ is also connected to the gate terminal of the transistor 745$_1$.

A source terminal of the transistor 745$_1$ is connected to a voltage source or voltage supply. A drain terminal of the transistor 745$_1$ is connected to a first terminal of a second middle resistor $R_{M2}$. The drain terminal of the transistor 745$_1$ defines an output for one of the second voltage reference nodes, REF2.

The voltage generation circuit 700 also comprises a second DAC 710$_2$ connected to a first input terminal of a second OPAMP 720$_2$. An output of the OPAMP 720$_2$ is connected to a gate terminal of a transistor 740$_2$. A source terminal of the transistor 740$_2$ is connected to a second terminal of middle resistor $R_{M1}$. The source terminal of the transistor 740$_2$ is also connected in a feedback arrangement to a second input terminal of the second OPAMP 720$_2$. The source terminal of the transistor 740$_2$ defines an output for another one of the first voltage reference nodes, −REF1. A drain terminal of the transistor 740$_2$ is connected to ground.

Resistor $R_2$ is connected between the gate terminal of the transistor 740$_2$ and a gate terminal of a transistor 745$_2$.

A first controllable current source 730$_2$ is connected between a voltage supply and a second controllable current source 735$_2$. The second controllable current source is connected between the first controllable current source 730$_2$ and a ground terminal. A node between the two controllable current sources 730$_2$ and 735$_2$ is also connected to the gate terminal of the transistor 745$_2$.

A drain terminal of the transistor 745$_2$ is connected to a second terminal of the second middle resistor $R_{M2}$ and the source terminal of the transistor 745$_2$ defines an output for one of the second voltage reference nodes, −REF2. A source terminal of the transistor 745$_2$ is connected to ground.

Explanation of the circuit can be simplified by considering one channel of the voltage generation circuitry 700. Since both channels behave in largely the same way, reference can be made to components by omitting the subscript numerals.

The DAC 710 controls the voltage output from the OPAMP 720, and the output of the OPAMP 720 controls the gate terminal of a first transistor 740. The voltage at the gate terminal of the first transistor 740 controls a reference voltage REF1 seen at the drain terminal. The controllable current sources 730 and 735 are configured to pull or sink a current from or into the resistor R causing a shift in voltage between the output of the OPAMP 720 and the gate terminal of the second transistor 745. The voltage at the gate terminal of the second transistor 745 controls a reference voltage REF2 seen at the drain terminal. This shift in voltage between the gate terminal of the first transistor 740 and the gate terminal of the second transistor 745 controls the difference between the voltages REF1 and REF2.

Similar explanation applies to the other channel for the voltages −REF1 and −REF2. Moreover, by controlling the controllable current sources 730 and 735, the voltage levels (REF2, −REF2) of the second voltage reference 220 may be set relative to the voltage levels (REF1, −REF1) of the first voltage reference 150.

The circuitry 700 may be configured to output any number of REF and −REF signals for other voltage references (e.g. REF3 and −REF3 for a third voltage reference, as mentioned earlier), using further instances of the controllable current sources and further transistors. Effectively, each of the voltage references has a pair of regulated nodes (e.g. REF1 and −REF1), and any number of pairs of such nodes could be regulated in a similar manner. Also, although REF2 and −REF2 are dependent on REF1 and −REF1 in FIG. 8 this is not essential and REF2 and −REF2 could be controlled independently of REF1 and −REF1.

Figure 9:
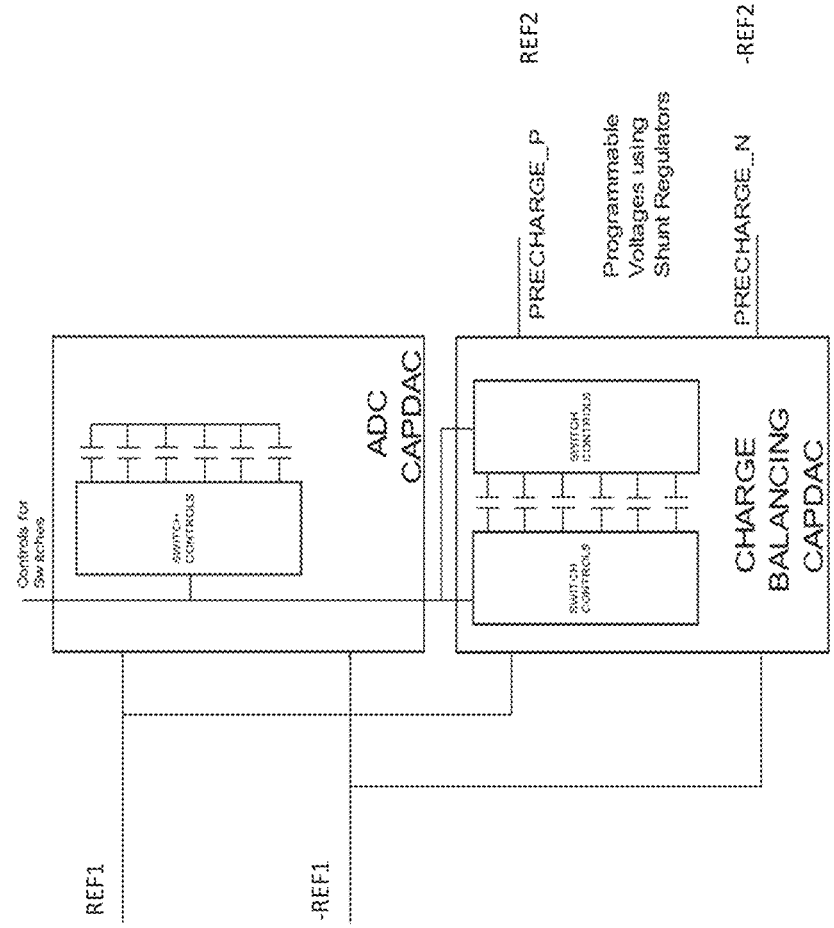
FIG. 9 is a schematic diagram of an implementation of the ADC unit embodying the present invention, in which a second voltage reference is variable.

FIG. 9 is a schematic diagram of an implementation 800 of ADC unit 200, in which the second voltage reference 220 (which affects the compensation circuitry 210) is variable, i.e. may be controlled or programmed.

In the implementation 800, the SAR ADC 130 is shown as ADC circuitry (labelled as ADC CAPDAC) and the compensation circuitry 210 is shown as a CHARGE BALANCING CAPDAC. The control circuitry 140 and the first and second voltage references 150, 220 are not explicitly shown although their nodes REF1, −REF1, REF2, −REF2 are shown for ease of understanding. It is emphasized that the representation in FIG. 9 is schematic.

In the implementation 800, the voltage levels REF2 and −REF2 (shown as PRECHARGE_P and PRECHARGE_N, respectively) may be controlled or programmed in order to control the compensation charge stored on the at least one compensation capacitor, and thus the values of the third and fourth charges. For example, with reference to FIG. 6, it can be appreciated that the voltage levels REF2 and −REF2 affect the values of the third and fourth charges. It is recalled from FIG. 8 that by controlling the controllable current sources 730 and 735, the voltage levels (REF2, −REF2) of the second voltage reference 220 may be set relative to the voltage levels (REF1, −REF1) of the first voltage reference 150.

Of course, this is just an example and the voltage levels (REF1, −REF1) of the first voltage reference 150 could be adjusted (controlled) relative to the voltage levels (REF2, −REF2) of the second voltage reference 220 instead, or both sets of voltage levels could be adjusted. Any one or more of the voltage levels (REF1, −REF1, REF2, −REF2) could be adjusted to control the third and fourth charges relative to the first and second charges.

In the case of FIG. 9, the voltage levels (REF2, −REF2) of the second voltage reference 220 may be considered parameters which may be controlled to adjust an extent to which the third and fourth charges compensate for the first and second charges, respectively. The control circuitry 140 (not shown in FIG. 9) may be configured to adjust at least one such parameter to adjust an extent to which the third and fourth charges compensate for the first and second charges, respectively.

Figure 10:
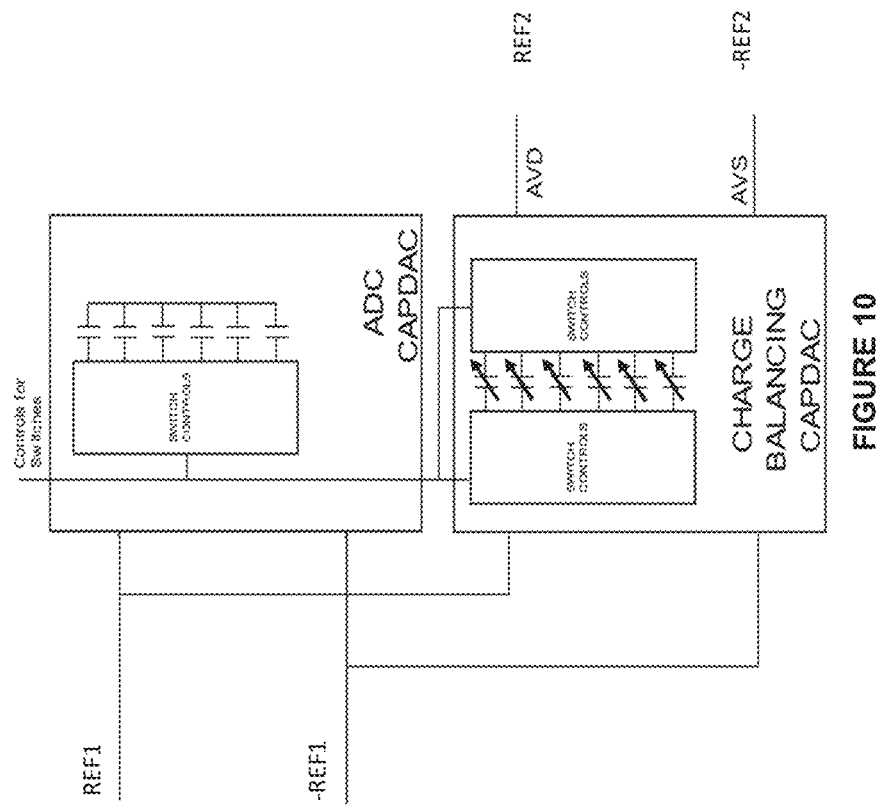
FIG. 10 is a schematic diagram of an implementation of the ADC unit embodying the present invention, in which the compensation circuitry itself is variable.

FIG. 10 is a schematic diagram of an implementation 900 of ADC unit 200, in which the compensation circuitry 210 itself is variable, i.e. may be controlled or programmed.

In the implementation 900, like the implementation 800, the SAR ADC 130 is shown as ADC circuitry (labelled as ADC CAPDAC) and the compensation circuitry 210 is shown as a CHARGE BALANCING CAPDAC. The control circuitry 140 and the first and second voltage references 150, 220 are not explicitly shown although their nodes REF1, −REF1, REF2, −REF2 are shown for ease of understanding.

In the implementation 900, the at least one compensation capacitor (e.g. capacitors 212 and 214 in implementation 300) may be controlled or programmed in order to control the compensation charge stored on the at least one compensation capacitor, and thus the values of the third and fourth charges. Although all capacitors are shown as variable in FIG. 10 this is schematic and at least one capacitor may be variable. The number of capacitors shown is also schematic to indicate that more than one may be provided—the number may differ from arrangement to arrangement. For example, with reference to FIG. 6, it can be appreciated that the capacitances of the capacitors 212 and 214 (16C and 16C) affect the values of the third and fourth charges.

Of course, this is just an example and the capacitances of the capacitors in the CDAC 190 could be additionally or alternatively adjusted (controlled). In the case of FIG. 10, the capacitances of the one or more compensation capacitors may be considered parameters which may be controlled to adjust an extent to which the third and fourth charges compensate for the first and second charges, respectively. The control circuitry 140 (not shown in FIG. 10) may be configured to adjust at least one such parameter to adjust an extent to which the third and fourth charges compensate for the first and second charges, respectively.

Looking at FIGS. 9 and 10, the control circuitry 140 may be configured to adjust the at least one parameter based on a measure of settling time of the first voltage reference 150 (as a measure of performance or stability of the first voltage reference 150), optionally of settling time of the first voltage reference responsive to the subconversion operation (for example, a history of settling times for instances of the subconversion operation). The settling time may be defined as the settling time of at least one regulated voltage level of the first voltage reference 150. For example, the settling time of the first voltage reference 150 may be defined as the time taken for one of the first voltage reference nodes (e.g. REF1) to return to a default or stable voltage level after a charge is drawn from or injected into said node. Also, voltages (FIG. 9) and/or capacitances (FIG. 10) may be adjusted.

FIG. 11 is a graph showing settling time for the first voltage reference 150 of ADC unit 200 in comparison with the ADC unit 100, as indicated.

The figure shows a graph of voltage (mV) versus time (ns), the voltage representing that of a node (e.g. REF1) of the first voltage reference 150.

Each sudden drop in voltage level is caused by charge being injected into or drawn from the first voltage reference by a corresponding subconversion operation, with the first (and largest) drop representing the MSB conversion. Because the MSB capacitors in the CDAC 190 are responsible for the largest charge drawn from or injected into the reference nodes, they cause the largest change in voltage level. As operation continues, the next most significant bit, MSB−1, is then converted, and draws or injects a smaller amount of charge in comparison to the MSB. This results in a smaller change in voltage level of the voltage reference node concerned.

For each subsequent subconversion operation, working from left to right (and MSB to LSB), it can be seen that the first voltage reference 150 for the ADC unit 200 recovers to around the stable voltage value in a time much less than for the ADC unit 100.

FIG. 12 is a graph showing the effect on noise performance of ADC unit 200 in comparison with the ADC unit 100, as indicated. Specifically, FIG. 12 shows Signal to Noise and Distortion ratio (SINAD) in both cases, with an FFT plot of Signal to Noise and Distortion ratio (dB) versus Frequency (MHz).

Due to a faster settling time, the Signal to Noise and Distortion ratio of ADC unit 200 is increased significantly as compared to the ADC unit 100. As shown in FIG. 12, the signal can clearly be seen as the peak at around 10 MHz, while the noise contribution at frequencies above 10 Hz reduced for ADC unit 200. In the example simulation, Signal to Noise and Distortion ratio was increased from 45.34 dB to 64.81 dB.

Figure 13:
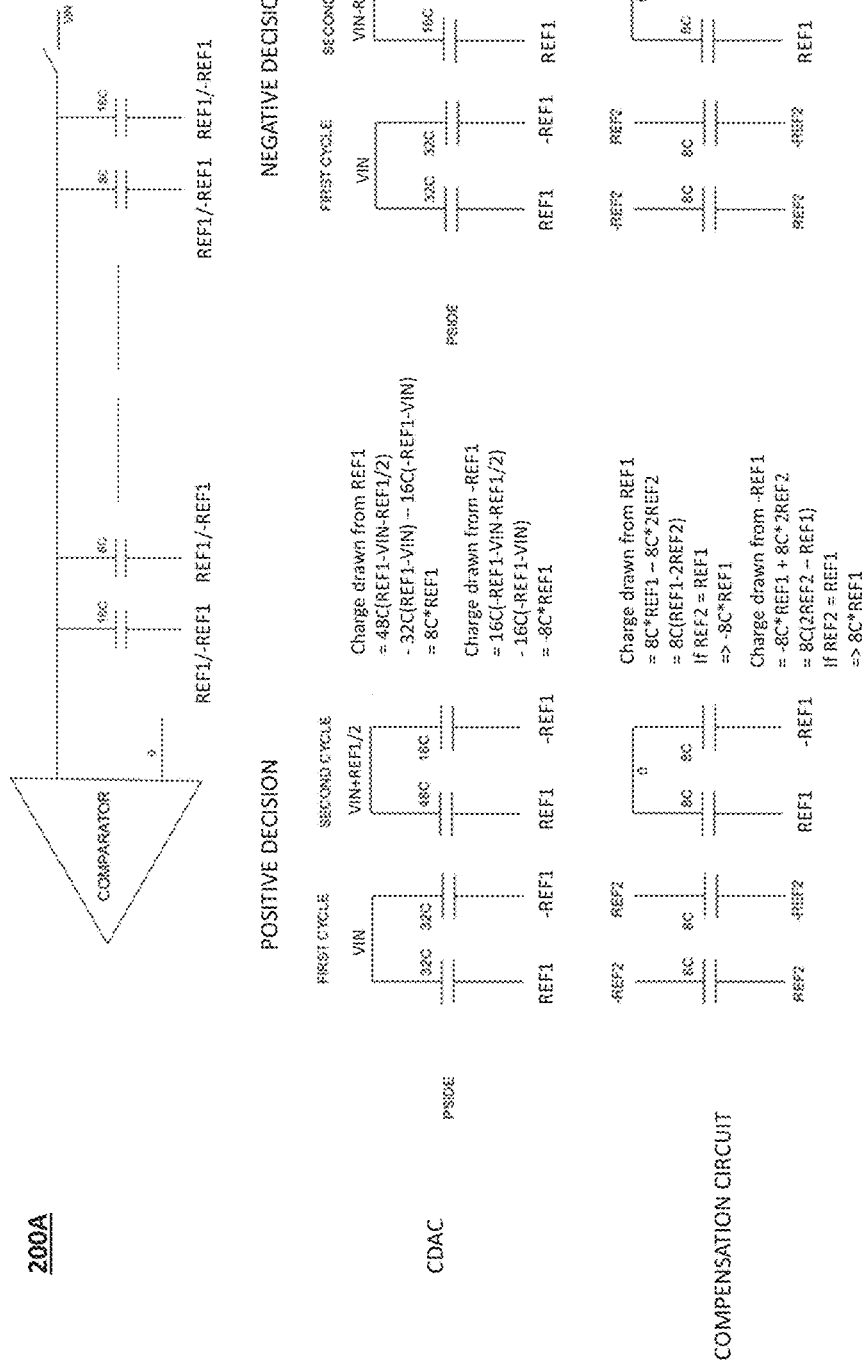
FIG. 13 is a schematic diagram representing a single-ended SAR ADC, useful for understanding how a corresponding technique can be applied.

FIG. 13 is a schematic diagram representing a single-ended SAR ADC 200A (in simplified form), useful for understanding how a corresponding technique can be applied. Equivalent capacitance circuits are shown in the same way as FIG. 6.

In the single-ended SAR ADC 200A of FIG. 13, all CDAC capacitors are connected to a single input terminal of the comparator, instead of a set of capacitors connected to each of the positive and negative terminals, as shown in FIG. 1.

In more detail, the first comparator input terminal is connected to a voltage input $V_{IN}$. The first comparator input terminal is also connected to first terminals of a first array of capacitors weighted 16C, 8C, 4C, 2C and C. For simplicity, only first capacitors 16C and 8C are shown. The first comparator input terminal is also connected to first terminals of a second array of capacitors similarly weighted C, 2C, 4C, 8C and 16C. For simplicity, only second capacitors 8C and 16C are shown. Also, termination capacitors are ignored here, again for simplicity.

Second terminals of the first and second array of capacitors are configured to be switched between either a positive reference node REF1, or a negative reference node −REF1.

The second comparator input terminal is connected to ground, or a reference voltage, marked in the example as 0.

Taking the MSB subconversion operation as an example, a decision is made as to whether the voltage seen at the input terminal should be raised or lowered. The second terminal of the first 16C weighted capacitor is switched from the positive reference node REF1 to the negative reference node −REF1 in the case of a negative decision, or the second 16C capacitor is switched from the negative reference node −REF1 to the positive reference node REF1, in the case of a positive decision.

Looking at the equivalent capacitance circuits, initially the first array of capacitors are connected to the positive reference node REF1, forming an equivalent capacitance of 32C, and the second array of capacitors are connected to the negative reference node −REF1, also forming an equivalent capacitance also of 32C. The voltage $V_{IN}$ is seen at the first comparator input terminal, effectively on the connection between the 32C equivalent array of capacitors.

Based on the result of the decision, one of the 16C capacitors will switch to being connected to the other of the positive reference node or the negative reference node. This results in equivalent capacitances in the equivalent capacitance circuit of 48C and 16C, and the voltage $V_{IN}$ changing to $V_{IN}$+REF1/2 or $V_{IN}$−REF1/2, depending on the decision.

In the same way as described with reference to FIG. 6, a charge will be drawn from a first reference node and a charge will be injected into a second reference node. In the case of a positive decision, charge is drawn from the positive reference node REF1 when the connected capacitance changes from 32C to 48C, and a charge is injected into the negative reference node −REF1 when the connected capacitance changes from 32C to 16C. In the case of a negative decision, charge is drawn from the negative reference node −REF1 when the connected capacitance changes from 32C to 48C, and a charge is injected into the positive reference node REF1 when the connected capacitance changes from 32C to 16C.

Calculations corresponding to the charge drawn from the first reference node and the charge drawn from the second reference node can be seen alongside the equivalent capacitance circuits in FIG. 13. The charges are calculated in the same way as the charges in relation to FIG. 6.

Again, in the same way as previously described, compensation circuitry may be implemented in order to compensate for these drawn and injected charges. Compensation capacitors may be charged, in the pre-charge operation (or FIRST CYCLE), to the compensation charge. A compensation charge is then injected into a first reference node to compensate for the charge drawn from it, and a compensation charge may be drawn from a second reference node to compensate for the charge injected into it, during the sub-conversion operation (or SECOND CYCLE).

As can be appreciated, the compensation charges are drawn and injected in the same way as the differential example, and the ADC unit 200 can also be implemented as such a single-ended ADC 200A.

Figure 14:
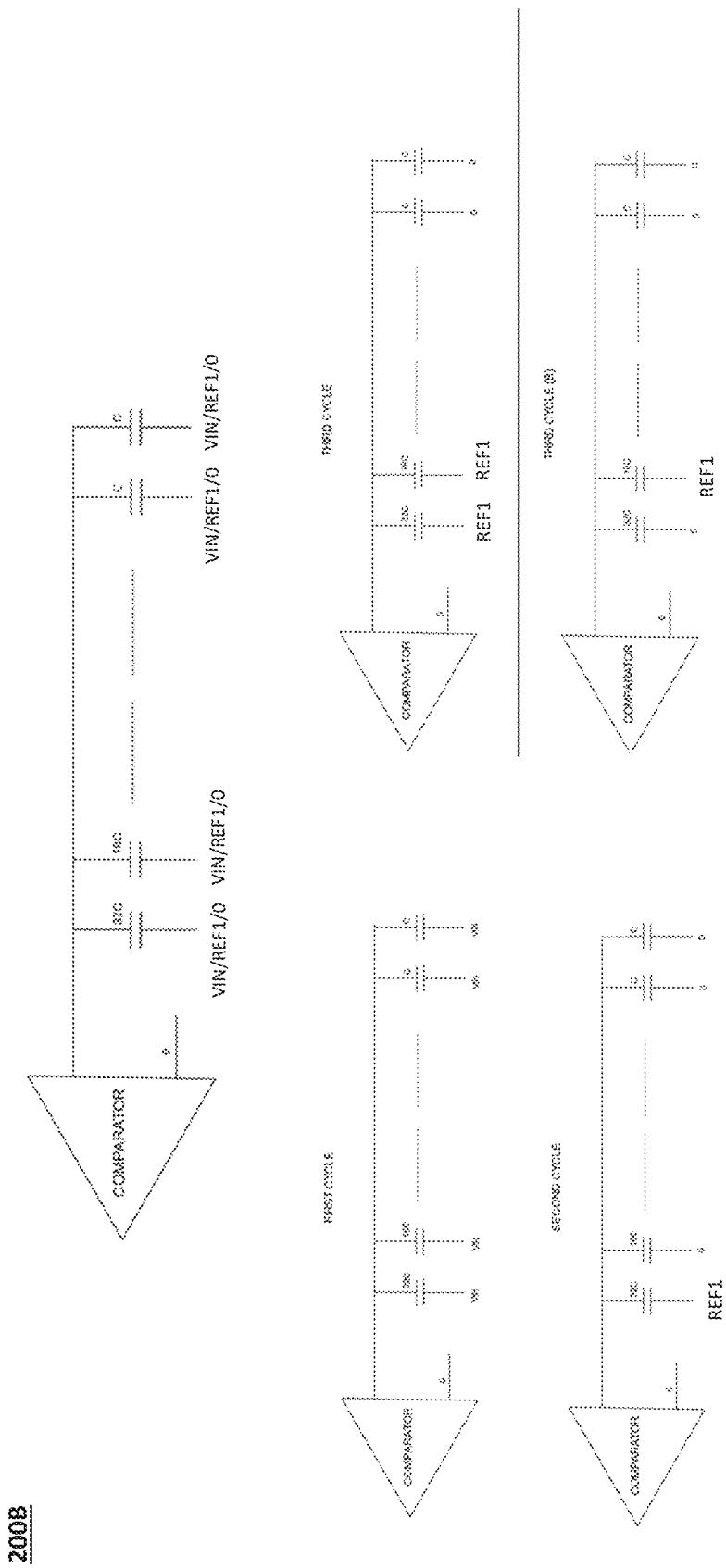
FIG. 14 is a schematic diagram representing a further single-ended SAR ADC, useful for understanding how a corresponding technique can be applied.

FIGS. 14 and 15 are schematic diagrams representing a further single-ended SAR ADC 200B (in simplified form), useful for understanding how a corresponding technique can be applied. Equivalent capacitance circuits are shown in the same way as FIG. 6.

In the single-ended SAR ADC 200B of FIG. 14, again all CDAC capacitors are connected to a single input terminal of the comparator. The first comparator input terminal is connected to first terminals of an array of capacitors weighted 32C, 16C, 8C, 4C, 2C, C and C respectively. The second capacitor with weight C is a termination capacitor. For simplicity, only capacitors 32C, 16C, C and C are shown. Second terminals of the array of capacitors are configured to be switched between either an input signal VIN, a positive reference node REF1, or a ground reference node 0. The second comparator input terminal is connected to ground, or a reference voltage, also marked in the example as 0.

Taking the MSB subconversion operation as an example, FIG. 14 shows the cycles of operation relating to the subconversion operation. The first cycle, marked as FIRST CYCLE, shows the second terminals of all capacitors connected to VIN. The charge stored on each capacitor is then proportional to the weighting of the capacitance of the capacitor. The second cycle, marked as SECOND CYCLE, shows the second terminal of the 32C capacitor, the MSB, switch from VIN to the positive reference node REF1. The second terminals of all remaining capacitors switch from VIN to the ground reference node 0.

A comparison is made between the voltage seen at the first comparator input terminal and the voltage at the second comparator input terminal. If the voltage at the first input terminal is larger than the second input terminal, the decision is positive. If the voltage at the first input terminal is less than the voltage at the second input terminal, the decision is negative. In the case of a positive decision, the second terminal of the 32C capacitor remains connected to the positive reference node REF1, and is shown as such in the cycle marked THIRD CYCLE. In the case of a negative decision, the second terminal of the 32C capacitor switches from the positive reference node REF1 to the ground reference node 0, and is shown as such in the cycle marked THIRD CYCLE (B).

FIG. 15 shows the same single-ended ADC circuitry 200B of FIG. 14, along with the corresponding equivalent capacitance circuits (corresponding to those of FIG. 6).

Initially, in the FIRST CYCLE, the capacitors are all connected to the input signal VIN, forming an equivalent capacitance of 32C, the MSB, in parallel with an equivalent capacitance of the remaining non-MSBs, also totaling 32C. The voltage 0 is seen at the first comparator input terminal (after reset), effectively on the connection between the two 32C equivalent capacitors.

In the SECOND CYCLE, one of the 32C capacitors, representing the MSB, switches from being connected to VIN to positive reference node REF1. This causes the voltage at the first comparator input terminal to change. The comparator performs a comparison between the two input terminals and a decision is made as to whether the voltage seen at the input terminal should be raised or lowered.

Due to the switching in the SECOND CYCLE, a charge will be drawn from a first reference node and a charge will be injected into a second reference node, in the same way as described with reference to FIG. 6. Calculations corresponding to the charge drawn from the first reference node and the charge injected into the second reference node can be seen alongside the equivalent capacitance circuits in FIG. 15. The charges are calculated in the same way as the charges in relation to FIG. 6.

In the same way as previously described, compensation circuitry (not shown) may be implemented in order to compensate for these drawn and injected charges. Compensation capacitors may be charged, in the pre-charge operation (or FIRST CYCLE), to the compensation charge. A compensation charge is then injected into a first reference node to compensate for the charge drawn from it, and a compensation charge may be drawn from a second reference node to compensate for the charge injected into it, during the subconversion operation (or SECOND CYCLE).

Based on the result of the decision, the 32C capacitor will remain connected the positive reference node REF1 (in a THIRD CYCLE), or switch to being connected to the ground reference node 0 (in a THIRD CYCLE (B)). The next most significant bit, the 16C capacitor, will switch to being connected to the positive reference node (see FIG. 14), ready for subsequent comparison operations. The switching of the 32C capacitor results in equivalent capacitances in the equivalent capacitance circuit of 48C and 16C.

In the same way as described with reference to FIG. 6, a charge will be drawn from a first reference node and a charge will be injected into a second reference node.

In the case of a positive decision (shown in THIRD CYCLE equivalent capacitance circuit), charge is drawn from the positive reference node REF1 when the connected capacitance changes from 32C to 48C, and a charge is injected into the ground reference node 0 when the connected capacitance changes from 32C to 16C. In the case of a negative decision (shown in THIRD CYCLE (B) equivalent capacitance circuit), charge is drawn from the ground reference node 0 when the connected capacitance changes from 32C to 48C, and a charge is injected into the positive reference node REF1 when the connected capacitance changes from 32C to 16C.

Calculations corresponding to the charge drawn from the first reference node and the charge drawn from the second reference node can be seen alongside the equivalent capacitance circuits in FIG. 15. The charges are calculated in the same way as the charges in relation to FIG. 6.

Again, in the same way as previously described, compensation circuitry (not shown) may be implemented in order to compensate for these drawn and injected charges. Compensation capacitors may be charged, in the pre-charge operation (or FIRST CYCLE), to the compensation charge. A compensation charge is then injected into a first reference node to compensate for the charge drawn from it, and a compensation charge may be drawn from a second reference node to compensate for the charge injected into it, during the THIRD CYCLE or THIRD CYCLE (B).

This compensation may be performed by an additional compensation circuitry 210, or an additional set of compensation capacitors in the existing compensation circuitry 210. The additional compensation circuitry 210 or additional set of compensation capacitors may alternatively be precharged in the SECOND CYCLE, and compensate for a charge drawn or a charge injected in the THIRD CYCLE or THIRD CYCLE (B).

The compensation circuitry may compensate for the charge drawn and injected in the SECOND CYCLE, for the charge drawn and injected in the THIRD CYCLE or THIRD CYCLE (B), or for the charge drawn and injected in both the SECOND CYCLE and the THIRD CYCLE or the THIRD CYCLE (B).

As can be appreciated, the compensation charges are drawn and injected in the same way as the differential example, and the ADC unit 200 can also be implemented as such a single-ended ADC 200B.

Figure 16:
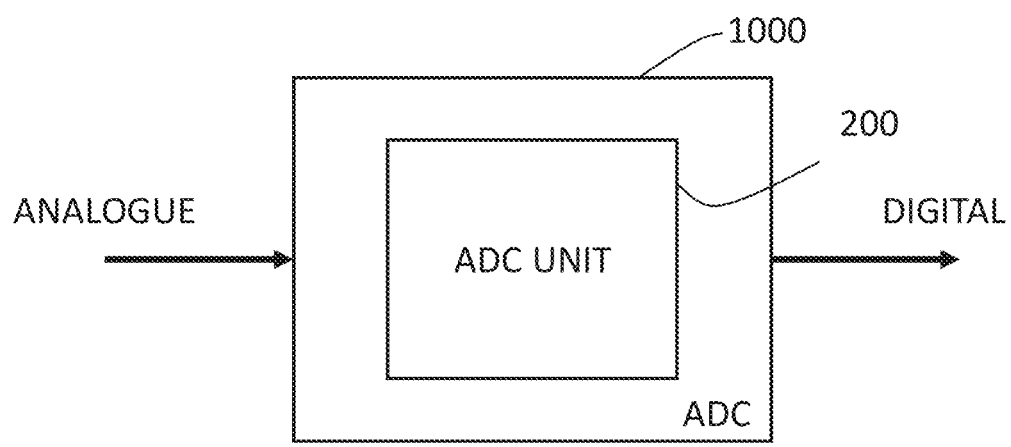
FIG. 16 is a schematic diagram of analogue-to-digital converter, or ADC, circuitry embodying the present invention.

FIG. 16 is a schematic diagram of analogue-to-digital converter, or ADC, circuit (or circuitry) 1000 embodying the present invention. Such an analogue-to-digital converter circuit may comprise multiple instances of ADC unit 200.

Figure 17:
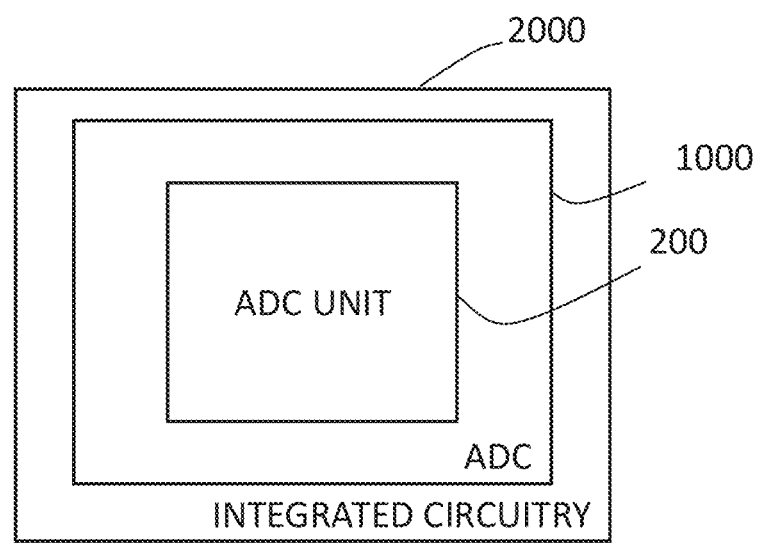
FIG. 17 is a schematic diagram of an integrated circuit (or circuitry) embodying the present invention.

FIG. 17 is a schematic diagram of an integrated circuit (or circuitry) 2000 embodying the present invention. Such integrated circuitry may comprise analogue-to-digital converter circuitry and/or ADC unit 200. Such integrated circuitry may be representative of some or all of an IC chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

The present invention may be embodied in many different ways in the light of the above disclosure, within the spirit and scope of the appended claims.

The disclosure extends to the following statements:

A.
A1. Analogue-to-digital converter, ADC, circuitry comprising:

successive-approximation circuitry configured in a subconversion operation to draw a charge from a first voltage reference, REF1;
compensation circuitry comprising at least one compensation capacitor and configured, in a precharge operation prior to the subconversion operation, to connect the at least one compensation capacitor so that the at least one compensation capacitor stores a compensation charge, and, in the subconversion operation, to connect the at least one compensation capacitor to the first voltage reference so that a charge is injected into the first voltage reference, REF1; and
control circuitry,
wherein:
the successive-approximation circuitry and the compensation circuitry are configured such that one or more parameters defining at least one of said charges are controllable; and
the control circuitry is configured to adjust at least one said parameter to adjust an extent to which the charge injected into the first voltage reference, REF1, by the compensation circuitry compensates for the charge drawn from the first voltage reference, REF1, by the successive-approximation circuitry.

A2. The ADC circuitry of statement A1, wherein the control circuitry is configured to adjust the at least one said parameter based on a measure of settling time of the first voltage reference, optionally of settling time of the first voltage reference responsive to one or more previous subconversion operations.

A3. The ADC circuitry of statement A2, wherein the settling time is the settling time of at least one regulated voltage level of the first voltage reference.

A4. The ADC circuitry of any of statements A1 to A3, wherein the one or more parameters comprise at least one of:
  a voltage level of at least one REF1 node to which the at least one compensation capacitor is connected in the subconversion operation;
  a capacitance of at least one capacitor of the successive-approximation circuitry;
  a voltage level of at least one voltage-reference node to which the at least one compensation capacitor is connected in the precharge operation; and
  a capacitance of the at least one compensation capacitor.

A5. The ADC circuitry of any of statements A1 to A4, wherein:
  the successive-approximation circuitry comprises an array of capacitors and is configured in the subconversion operation to switch at least one of the array of capacitors between different REF1 nodes of the first voltage reference, REF1, having different defined voltage levels such that a first charge is drawn from a first REF1 node and a second charge is injected into a second REF1 node;
  the compensation circuitry is configured, in the subconversion operation, to connect the at least one compensation capacitor between the first and second REF1 nodes so that a third charge is injected into the first REF1 node and a fourth charge is drawn from the second REF1 node; and
  the control circuitry is configured to adjust the at least one said parameter to adjust an extent to which the third and fourth charges compensate for the first and second charges, respectively.

A6. The ADC circuitry of statement A5, wherein the compensation circuitry is configured, in the precharge operation, to connect the at least one compensation capacitor between different REF2 nodes of a second voltage reference, REF2, having different defined voltage levels so that the at least one compensation capacitor stores the compensation charge.

A7. The ADC circuitry of statement A6, wherein the compensation circuitry is configured, in the subconversion operation, to disconnect the at least one compensation capacitor from at least a first REF2 node to which the at least one compensation capacitor is connected in the precharge operation.

A8. The ADC circuitry of statement A7, wherein the first voltage reference is configured to regulate the voltage level of at least the first REF1 node and/or the second voltage reference is configured to regulate the voltage level of at least the first REF2 node.

A9. The ADC circuitry of statement A7 or A8, wherein the first voltage reference is configured to regulate the voltage level of the first REF1 node and the voltage level of the second REF1 node, optionally relative to a voltage level of a shared reference node, such as a ground node.

A10. The ADC circuitry of any of statements A7 to A9, wherein the second voltage reference is configured to regulate the voltage level of the first REF2 node and the voltage level of a second REF2 node to which the at least one compensation capacitor is connected in the precharge operation, optionally relative to a voltage level of the or another shared reference node, such as a ground node.

A11. The ADC circuitry of statement A10, wherein the compensation circuitry is configured, in the subconversion operation, to disconnect the at least one compensation capacitor from the first and second REF2 nodes and connect the at least one compensation capacitor between the first and second REF1 nodes.

A12. The ADC circuitry of any of statements A5 to A11, wherein the compensation circuitry is configured such that the at least one compensation capacitor is disconnected from the first and second REF1 nodes in the precharge operation.

A13. The ADC circuitry of statement A7 or A8, wherein the first voltage reference is configured to regulate the voltage level of the first REF1 node relative to the voltage level of the second REF1 node.

A14. The ADC circuitry of statement A7, A8 or A13, wherein the second voltage reference is configured to regulate the voltage level of the first REF2 node relative to the voltage level of a second REF2 node to which the at least one compensation capacitor is connected in the precharge operation.

A15. The ADC circuitry of statement A14, wherein the second REF1 node and the second REF2 node are connected together and constitute a shared reference node, such as a ground node.

A16. The ADC circuitry of any of statements A5 to A15, wherein the compensation circuitry is configured such that the at least one compensation capacitor is disconnected from at least the first REF1 node in the precharge operation.

A17. The ADC circuitry of any of statements A1 to A16, comprising the first voltage reference, REF1, and/or the second voltage reference, REF2.

A18. The ADC circuitry of any of statements A1 to A17, wherein:
said subconversion operation is a first subconversion operation, said at least one compensation capacitor is at least one first compensation capacitor, said precharge operation is a first precharge operation, and said compensation charge is a first compensation charge;
the successive-approximation circuitry is configured in a second subconversion operation to draw a charge from the first voltage reference, REF1;
the compensation circuitry comprises at least one second compensation capacitor and is configured, in a second precharge operation prior to the second subconversion operation, to connect the at least one second compensation capacitor so that the at least one second compensation capacitor stores a second compensation charge, and, in the second subconversion operation, to connect the at least one second compensation capacitor to the first voltage reference so that a charge is injected into the first voltage reference, REF1;
the successive-approximation circuitry and the compensation circuitry are configured such that one or more parameters defining at least one of said charges are controllable; and
the control circuitry is configured to adjust at least one said parameter to adjust an extent to which the charge injected into the first voltage reference, REF1, by the compensation circuitry in the second subconversion operation compensates for the charge drawn from the first voltage reference, REF1, by the successive-approximation circuitry in the second subconversion operation,
optionally wherein the compensation circuitry is configured, in the second precharge operation, to connect the at least one second compensation capacitor between different REF3 nodes of a third voltage reference, REF3, having different defined voltage levels so that the at least one second compensation capacitor stores the second compensation charge.

A19. Integrated circuitry, such as an IC chip, comprising the ADC circuitry of any of statements A1 to A18.

X.

X1. Analogue-to-digital converter, ADC, circuitry comprising:
successive-approximation circuitry configured in a subconversion operation to draw a charge from a first voltage reference, REF1;
compensation circuitry configured, in a precharge operation prior to the subconversion operation, to store a compensation charge, and, in the subconversion operation, to connect to the first voltage reference so that a charge dependent on the compensation charge is injected into the first voltage reference, REF1; and
control circuitry,
wherein:
the successive-approximation circuitry and the compensation circuitry are configured such that one or more parameters defining at least one of said charges are controllable; and
the control circuitry is configured to adjust at least one said parameter to adjust an extent to which the charge injected into the first voltage reference, REF1, compensates for the charge drawn from the first voltage reference, REF1.

X2. Analogue-to-digital converter, ADC, circuitry comprising:
a first voltage reference, REF1, having a plurality of REF1 nodes having different defined voltage levels;
a second voltage reference, REF2, having a plurality of REF2 nodes having different defined voltage levels;
successive-approximation circuitry comprising an array of capacitors and configured in a subconversion operation to switch at least one of the array of capacitors between different REF1 nodes such that a first charge is drawn from a first REF1 node and a second charge is injected into a second REF1 node;

compensation circuitry comprising at least one compensation capacitor and configured, in a precharge operation prior to the subconversion operation, to connect the at least one compensation capacitor between different REF2 nodes so that the at least one compensation capacitor stores a compensation charge, and, in the subconversion operation, to connect the at least one compensation capacitor between the first and second REF1 nodes so that a third charge is injected into the first REF1 node and a fourth charge is drawn from the second REF1 node; and control circuitry wherein:

the successive-approximation circuitry and the compensation circuitry are configured such that one or more parameters defining said charges are controllable; and the control circuitry is configured to adjust at least one said parameter to adjust an extent to which the third and fourth charges compensate for the first and second charges, respectively.

X3. Analogue-to-digital converter, ADC, circuitry comprising:

an ADC unit for carrying out analogue-to-digital subconversion operations to convert respective analogue signals into corresponding digital output values; and a compensating unit for supplying a compensatory charge to a voltage reference during a given conversion operation to compensate for a charge drawn by the ADC unit from the voltage reference during the given conversion operation, wherein:

before the given conversion operation, the compensating unit is charged toward a compensatory charge value; and the ADC circuitry is configured such that the compensatory charge is variable, either by varying the capacitance of the compensating unit, or by varying the voltage across the compensating unit.

B.

B1. Analogue-to-digital converter, ADC, circuitry comprising:

successive-approximation circuitry configured in a subconversion operation to draw a charge from a first voltage reference, REF1; and compensation circuitry comprising at least one compensation capacitor and configured, in a precharge operation prior to the subconversion operation, to connect the at least one compensation capacitor between nodes of a second voltage reference, REF2, so that the at least one compensation capacitor stores a compensation charge, and, in the subconversion operation, to disconnect the at least one compensation capacitor from at least one of said nodes of the second voltage reference, REF2, whose voltage is regulated by the second voltage reference, REF2, and connect the at least one compensation capacitor between nodes of the first voltage reference, REF1, so that a charge is injected into the first voltage reference, REF1.

B2. The ADC circuitry of statement B1, wherein the successive-approximation circuitry and the compensation circuitry are configured such that the charge injected into the first voltage reference, REF1, by the compensation circuitry at least partly compensates for the charge drawn from the first voltage reference, REF1, by the successive-approximation circuitry.

B3. The ADC circuitry of statement B1 or B2, wherein:

the second voltage reference, REF2, comprises a plurality of REF2 nodes having different defined voltage levels, the plurality of REF2 nodes comprising a first REF2 node and a second REF2 node, the second voltage reference configured to regulate the voltage level of the first REF2 node relative to the voltage level of the second REF2 node or to regulate the voltage level of the first REF2 node and the voltage level of the second REF2 node relative to a voltage level of a first shared reference node; and the compensation circuitry is configured, in the precharge operation, to connect the at least one compensation capacitor between the first and second REF2 nodes so that the at least one compensation capacitor stores the compensation charge, and, in the subconversion operation, to disconnect the at least one compensation capacitor from at least the first REF2 node.

B4. The ADC circuitry of statement B3, wherein:

the second voltage reference is configured to regulate the voltage level of the first REF2 node and the voltage level of the second REF2 node relative to the voltage level of the first shared reference node; and the compensation circuitry is configured, in the subconversion operation, to disconnect the at least one compensation capacitor from the first and second REF2 nodes.

B5. The ADC circuitry of statement B3 or B4, wherein:

the first voltage reference, REF1, comprises a plurality of REF1 nodes having different defined voltage levels, the plurality of REF1 nodes comprising a first REF1 node and a second REF1 node, the first voltage reference configured to regulate the voltage level of the first REF1 node relative to the voltage level of the second REF1 node or to regulate the voltage level of the first REF1 node and the voltage level of the second REF1 node relative to a voltage level of the first shared reference node or a second shared reference node;

the successive-approximation circuitry comprises an array of capacitors and is configured in the subconversion operation to switch at least one of the array of capacitors between different REF1 nodes such that a first charge is drawn from the first REF1 node and a second charge is injected into the second REF1 node; and the compensation circuitry is configured, in the subconversion operation, to connect the at least one compensation capacitor between the first and second REF1 nodes so that a third charge is injected into the first REF1 node and a fourth charge is drawn from the second REF1 node.

B6. The ADC circuitry of statement B5, wherein the compensation circuitry is configured such that the at least one compensation capacitor is disconnected from the first and second REF1 nodes in the precharge operation.

B7 The ADC circuitry of statement B5, wherein:

the first voltage reference is configured to regulate the voltage level of the first REF1 node relative to the voltage level of the second REF1 node;

the second voltage reference is configured to regulate the voltage level of the first REF2 node relative to the voltage level of the second REF2 node; and the second REF1 node and the second REF2 node are connected to the first shared reference node.

B8. The ADC circuitry of statement B7, wherein the compensation circuitry is configured such that the at least one compensation capacitor is disconnected from at least the first REF1 node in the precharge operation.

B9. The ADC circuitry of any of statements B5 to B8, wherein the successive-approximation circuitry and the compensation circuitry are configured such that the third and fourth charges at least partly compensate for the first and second charges, respectively.

B10. The ADC circuitry of any of statements B1 to B9, comprising control circuitry, wherein:
the successive-approximation circuitry and the compensation circuitry are configured such that one or more parameters defining at least one of said charges are controllable; and
the control circuitry is configured to adjust at least one said parameter to adjust an extent to which the charge injected into the first voltage reference, REF1, by the compensation circuitry compensates for the charge drawn from the first voltage reference, REF1, by the successive-approximation circuitry, or an extent to which the third and fourth charges compensate for the first and second charges, respectively.

B11. The ADC circuitry of statement B10, wherein the control circuitry is configured to adjust the at least one said parameter based on a measure of settling time of the first voltage reference, optionally of settling time of the first voltage reference responsive to one or more previous subconversion operations.

B12. The ADC circuitry of statement B11, wherein the settling time is the settling time of at least one regulated voltage level of the first voltage reference.

B13. The ADC circuitry of any of statements B10 to B12, wherein the one or more parameters comprise at least one of:
a voltage level of at least one REF1 node to which the at least one compensation capacitor is connected in the subconversion operation;
a capacitance of at least one capacitor of the successive-approximation circuitry;
a voltage level of at least one voltage-reference node to which the at least one compensation capacitor is connected in the precharge operation; and
a capacitance of the at least one compensation capacitor.

B14. The ADC circuitry of any of statements B1 to B13, comprising the first voltage reference, REF1, and/or the second voltage reference, REF2.

B15. The ADC circuitry of any of statements B1 to B14, wherein:
said subconversion operation is a first subconversion operation, said at least one compensation capacitor is at least one first compensation capacitor, said precharge operation is a first precharge operation, and said compensation charge is a first compensation charge;
the successive-approximation circuitry is configured in a second subconversion operation to draw a charge from the first voltage reference, REF1; and
the compensation circuitry comprises at least one second compensation capacitor and is configured, in a second precharge operation prior to the second subconversion operation, to connect the at least one second compensation capacitor between nodes of a third voltage reference, REF3, so that the at least one second compensation capacitor stores a second compensation charge, and, in the second subconversion operation, to disconnect the at least one second compensation capacitor from at least one of said nodes of the third voltage reference, REF3, whose voltage is regulated by the third voltage reference, REF3, and connect the at least one second compensation capacitor between nodes of the first voltage reference, REF1, so that a charge is injected into the first voltage reference, REF1.

B16. The ADC circuitry of statement B15, wherein the successive-approximation circuitry and the compensation circuitry are configured such that the charge injected into the first voltage reference, REF1, by the compensation circuitry in the second subconversion operation at least partly compensates for the charge drawn from the first voltage reference, REF1, by the successive-approximation circuitry in the second subconversion operation.

B17. The ADC circuitry of statement B15 or B16, wherein:
the third voltage reference, REF3, comprises a plurality of REF3 nodes having different defined voltage levels, the plurality of REF3 nodes comprising a first REF3 node and a second REF3 node, the third voltage reference configured to regulate the voltage level of the first REF3 node relative to the voltage level of the second REF3 node or to regulate the voltage level of the first REF3 node and the voltage level of the second REF3 node relative to a voltage level of a third shared reference node; and
the compensation circuitry is configured, in the second precharge operation, to connect the at least one second compensation capacitor between the first and second REF3 nodes so that the at least one second compensation capacitor stores the second compensation charge, and, in the second subconversion operation, to disconnect the at least one second compensation capacitor from at least the first REF3 node.

B18. The ADC circuitry of statement B17, wherein:
the third voltage reference is configured to regulate the voltage level of the first REF3 node and the voltage level of the second REF3 node relative to the voltage level of the third shared reference node; and
the compensation circuitry is configured, in the second subconversion operation, to disconnect the at least one second compensation capacitor from the first and second REF3 nodes.

B19. The ADC circuitry of statement B17 or B18, wherein:
the successive-approximation circuitry is configured in the second subconversion operation to switch at least one of its array of capacitors between different REF1 nodes such that a fifth charge is drawn from the first REF1 node and a sixth charge is injected into the second REF1 node; and
the compensation circuitry is configured, in the second subconversion operation, to connect the at least one second compensation capacitor between the first and second REF1 nodes so that a seventh charge is injected into the first REF1 node and an eighth charge is drawn from the second REF1 node.

B20. The ADC circuitry of statement B19, wherein the compensation circuitry is configured such that the at least one second compensation capacitor is disconnected from the first and second REF1 nodes in the second precharge operation.

B21. Integrated circuitry, such as an IC chip, comprising the ADC circuitry of any of statements B1 to B20.

Y.

Y1. Analogue-to-digital converter, ADC, circuitry comprising:
successive-approximation circuitry configured in a subconversion operation to draw a charge from a first voltage reference, REF1; and
compensation circuitry configured, in a precharge operation prior to the subconversion operation, to connect to nodes of a second voltage reference, REF2, to store a compensation charge, and, in the subconversion operation, to disconnect from at least one of said nodes of the second voltage reference, REF2, whose voltage is regulated by the second voltage reference, REF2, and connect to the first voltage reference, REF1 so that a charge is injected into the first voltage reference, REF1.

Y2. Analogue-to-digital converter, ADC, circuitry comprising:
  a first voltage reference, REF1, having a plurality of REF1 nodes having different defined voltage levels, the plurality of REF1 nodes comprising a first REF1 node and a second REF1 node, the first voltage reference configured to regulate the voltage level of the first REF1 node relative to the voltage level of the second REF1 node or to regulate the voltage level of the first REF1 node and the voltage level of the second REF1 node relative to a voltage level of a first shared reference node;
  a second voltage reference, REF2, having a plurality of REF2 nodes having different defined voltage levels, the plurality of REF2 nodes comprising a first REF2 node and a second REF2 node, the second voltage reference configured to regulate the voltage level of the first REF2 node relative to the voltage level of the second REF2 node or to regulate the voltage level of the first REF2 node and the voltage level of the second REF2 node relative to the voltage level of the first shared reference node or a second shared reference node;
  successive-approximation circuitry comprising an array of capacitors and configured in a subconversion operation to switch at least one of the array of capacitors between different REF1 nodes such that a first charge is drawn from the first REF1 node and a second charge is injected into the second REF1 node; and
  compensation circuitry comprising at least one compensation capacitor and configured, in a precharge operation prior to the subconversion operation, to connect the at least one compensation capacitor between the first and second REF2 nodes so that the at least one compensation capacitor stores a compensation charge, and, in the subconversion operation, to disconnect the at least one compensation capacitor from at least the first REF2 node and connect the at least one compensation capacitor between the first and second REF1 nodes so that a third charge is injected into the first REF1 node and a fourth charge is drawn from the second REF1 node.

The invention claimed is:

1. Analogue-to-digital converter, ADC, circuitry comprising:
  voltage reference circuitry comprising a first voltage reference, REF1, having first and second REF1 nodes having different voltage levels, and a second voltage reference, REF2, having first and second REF2 nodes having different voltage levels;
  successive-approximation circuitry configured in a subconversion operation to draw a first charge from the first REF1 node and inject a second charge into the second REF1 node; and
  compensation circuitry comprising at least one compensation capacitor and configured, in a precharge operation prior to the subconversion operation, to connect the at least one compensation capacitor between the first and second REF2 nodes so that the at least one compensation capacitor stores a compensation charge, and, in the subconversion operation, to disconnect the at least one compensation capacitor from the first and second REF2 nodes and connect the at least one compensation capacitor between the first and second REF1 nodes so that a third charge is injected into the first REF1 node and a fourth charge is drawn from the second REF1 node, wherein:
  the second voltage reference, REF2, is configured to regulate the voltage level of the first REF2 node relative to the voltage level of the first REF1 node, and to regulate the voltage level of the second REF2 node relative to the voltage level of the second REF1 node, so that the voltage levels of the first and second REF2 nodes are set relative to the voltage levels of the first and second REF1 nodes.

2. Integrated circuitry, comprising the ADC circuitry of claim 1.

3. The ADC circuitry of claim 1, wherein the successive-approximation circuitry and the compensation circuitry are configured such that the third and fourth charges at least partly compensate for the first and second charges, respectively.

4. The ADC circuitry of claim 1, comprising control circuitry, wherein:
  the successive-approximation circuitry and the compensation circuitry are configured such that one or more parameters defining at least one of said charges are controllable; and
  the control circuitry is configured to adjust at least one said parameter to adjust an extent to which the charge injected into the first voltage reference, REF1, by the compensation circuitry compensates for the charge drawn from the first voltage reference, REF1, by the successive-approximation circuitry, or an extent to which the third and fourth charges compensate for the first and second charges, respectively.

5. The ADC circuitry as claimed in claim 4, wherein the control circuitry is configured to adjust the at least one said parameter based on a measure of settling time of the first voltage reference, REF1, optionally of settling time of the first voltage reference, REF1, responsive to one or more previous subconversion operations.

6. The ADC circuitry of claim 5, wherein the settling time is the settling time of at least one of the voltage levels of the first voltage reference, REF1.

7. The ADC circuitry as claimed in claim 4, wherein the one or more parameters comprise at least one of:
  a voltage level of at least one REF1 node to which the at least one compensation capacitor is connected in the subconversion operation;
  a capacitance of at least one capacitor of the successive-approximation circuitry;
  a voltage level of at least one voltage-reference node to which the at least one compensation capacitor is connected in the precharge operation; and
  a capacitance of the at least one compensation capacitor.

8. The ADC circuitry as claimed in claim 1, wherein:
  the successive-approximation circuitry comprises an array of capacitors and is configured in the subconversion operation to switch at least one of the array of capacitors between different REF1 nodes of the first voltage reference, REF1, such that the first charge is drawn from the first REF1 node and the second charge is injected into the second REF1 node.

9. The ADC circuitry as claimed in claim 1, wherein:
  said subconversion operation is a first subconversion operation, said at least one compensation capacitor is at least one first compensation capacitor, said precharge operation is a first precharge operation, and said compensation charge is a first compensation charge;

the successive-approximation circuitry is configured in a second subconversion operation to draw a charge from the first voltage reference, REF1;

the compensation circuitry comprises at least one second compensation capacitor and is configured, in a second precharge operation prior to the second subconversion operation, to connect the at least one second compensation capacitor between nodes of a third voltage reference, REF3, so that the at least one second compensation capacitor stores a second compensation charge, and, in the second subconversion operation, to disconnect the at least one second compensation capacitor from at least one of said nodes of the third voltage reference, REF3, whose voltage is regulated by the third voltage reference, REF3, and connect the at least one second compensation capacitor between nodes of the first voltage reference, REF1, so that a charge is injected into the first voltage reference, REF1.

10. The ADC circuitry of claim 9, wherein:

the successive-approximation circuitry and the compensation circuitry are configured such that one or more parameters defining at least one of said charges are controllable, optionally wherein the control circuitry is configured to adjust at least one said parameter to adjust an extent to which the charge injected into the first voltage reference, REF1, by the compensation circuitry in the second subconversion operation compensates for the charge drawn from the first voltage reference, REF1, by the successive-approximation circuitry in the second subconversion operation, optionally wherein the compensation circuitry is configured, in the second precharge operation, to connect the at least one second compensation capacitor between different REF3 nodes of a third voltage reference, REF3, having different defined voltage levels so that the at least one second compensation capacitor stores the second compensation charge.

11. The ADC circuitry of claim 9, wherein the successive-approximation circuitry and the compensation circuitry are configured such that the charge injected into the first voltage reference, REF1, by the compensation circuitry in the second subconversion operation at least partly compensates for the charge drawn from the first voltage reference, REF1, by the successive-approximation circuitry in the second subconversion operation.

12. The ADC circuitry of claim 9, wherein:

the successive-approximation circuitry is configured in the second subconversion operation to switch at least one capacitor between different REF1 nodes such that a fifth charge is drawn from the first REF1 node and a sixth charge is injected into the second REF1 node; and the compensation circuitry is configured, in the second subconversion operation, to connect the at least one second compensation capacitor between the first and second REF1 nodes so that a seventh charge is injected into the first REF1 node and an eighth charge is drawn from the second REF1 node.

* * * * *